US012677699B2

(12) United States Patent
Sharma et al.

(10) Patent No.: US 12,677,699 B2
(45) Date of Patent: Jul. 7, 2026

(54) SILICON CARBIDE POWER DEVICES INTEGRATED WITH SILICON LOGIC DEVICES

(71) Applicant: Intel Corporation, Santa Clara, CA (US)

(72) Inventors: Abhishek Anil Sharma, Portland, OR (US); Tahir Ghani, Portland, OR (US); Anand Murthy, Portland, OR (US); Wilfred Gomes, Portland, OR (US); Sagar Suthram, Portland, OR (US); Pushkar Ranade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 17/955,253

(22) Filed: Sep. 28, 2022

(65) Prior Publication Data
US 2024/0105700 A1 Mar. 28, 2024

(51) Int. Cl.
H01L 23/48 (2006.01)
H01L 23/52 (2006.01)
(Continued)

(52) U.S. Cl.
CPC ......... H10W 90/00 (2026.01); H10W 20/023 (2026.01); H10W 20/20 (2026.01);
(Continued)

(58) Field of Classification Search
CPC ... H01L 25/18; H01L 23/481; H01L 23/5286; H01L 24/08; H01L 24/80; H01L 25/0657; H01L 2224/08145; H01L 2224/80895; H01L 2224/80896; H01L 2225/06541;

H01L 2924/10253; H01L 2924/10272; H01L 2924/1431; H01L 21/02378; H01L 21/02505; H01L 21/02447; H01L 25/0753; H01L 2924/1033; H01L 21/02502; H01L 21/02529; H01L 21/187; H01L 21/02507; H01L 21/185; H01L 21/02389; H01L 25/167; H01L 2924/13055; H01L 21/76898; H01L 2224/48472; H01L 23/3735; H01L 2924/1305; H01L 2224/8385; H01L 21/0245; H01L 21/02532; H01L 2924/13064; H01L 2224/49111; H01L 25/072; H01L 2224/48137; H01L 24/06;
(Continued)

(56) References Cited

U.S. PATENT DOCUMENTS

2015/0243737 A1* 8/2015 Escoffier .............. H03K 17/302
327/534
2020/0381398 A1* 12/2020 Lan ........................ H10D 88/00

* cited by examiner

*Primary Examiner* — Niki H Nguyen
(74) *Attorney, Agent, or Firm* — Essential Patents Group, LLP

(57) ABSTRACT

An embodiment of an integrated circuit (IC) device may include a plurality of layers of wide bandgap (WBG)-based circuitry and a plurality of layers of silicon (Si)-based circuitry monolithically bonded to the plurality of layers of WBG-based circuitry, with one or more electrical connections between respective WBG-based circuits in the plurality of layers of WBG-based circuitry and Si-based circuits in the plurality of layers of Si-based circuitry. In some embodiments, a wafer-scale WBG-based IC is hybrid bonded or layer transfer bonded to a wafer-scale Si-based IC. Other embodiments are disclosed and claimed.

22 Claims, 11 Drawing Sheets

(51) Int. Cl.

| | |
|---|---|
| *H01L 29/40* | (2006.01) |
| *H10W 20/00* | (2026.01) |
| *H10W 20/20* | (2026.01) |
| *H10W 20/41* | (2026.01) |
| *H10W 90/00* | (2026.01) |
| *H10W 80/00* | (2026.01) |
| *H10W 90/20* | (2026.01) |

(52) U.S. Cl.
CPC ........ *H10W 20/427* (2026.01); *H10W 80/312* (2026.01); *H10W 80/327* (2026.01); *H10W 90/288* (2026.01); *H10W 90/297* (2026.01); *H10W 90/792* (2026.01)

(58) Field of Classification Search
CPC . H01L 2224/32145; H01L 2224/85205; H01L 2224/05187; H01L 2224/32257; H01L 2224/83203; H01L 2224/83805; H01L 2224/04034
See application file for complete search history.

200

300

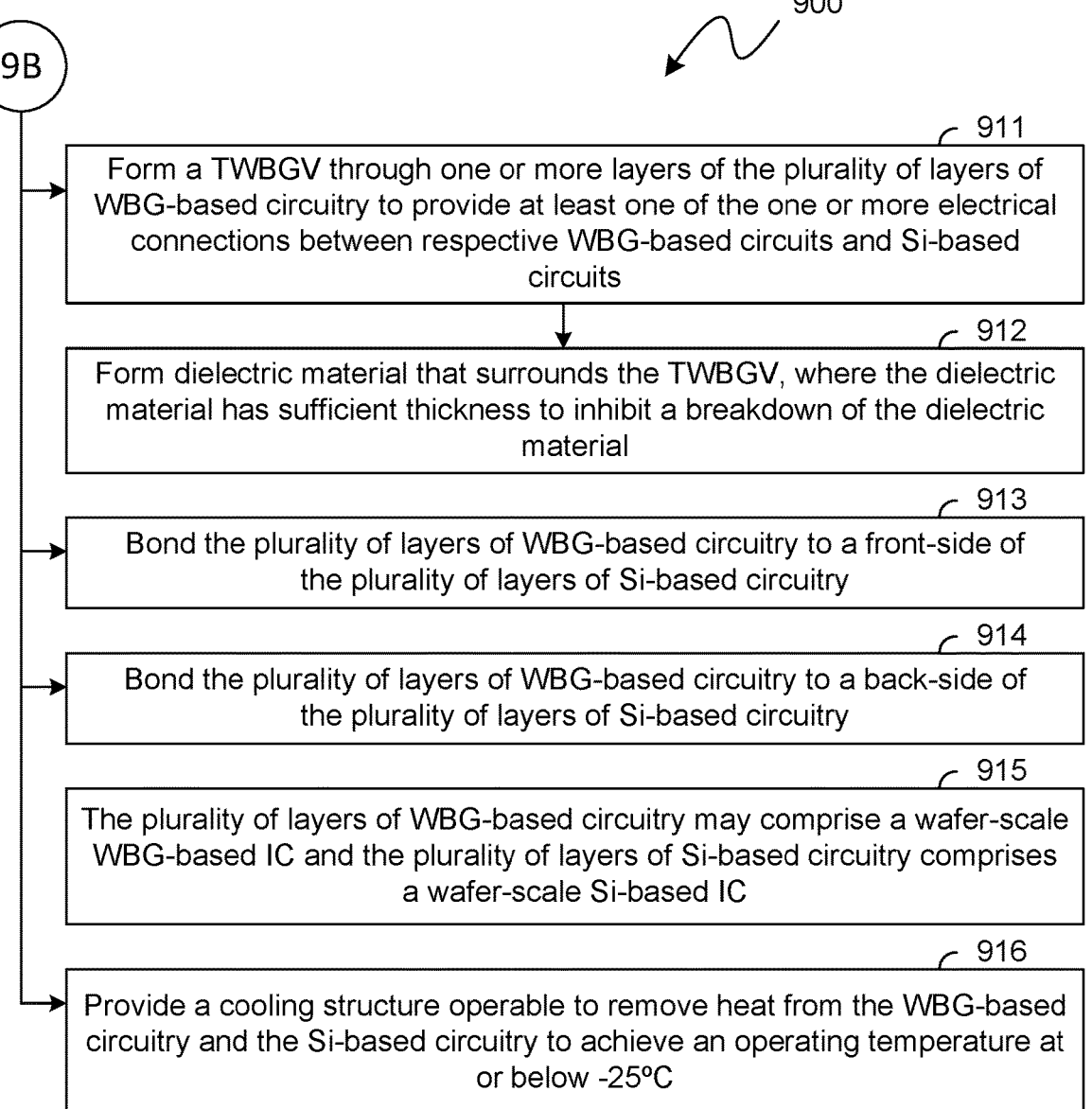

900

9B

911

Form a TWBGV through one or more layers of the plurality of layers of WBG-based circuitry to provide at least one of the one or more electrical connections between respective WBG-based circuits and Si-based circuits

912

Form dielectric material that surrounds the TWBGV, where the dielectric material has sufficient thickness to inhibit a breakdown of the dielectric material

913

Bond the plurality of layers of WBG-based circuitry to a front-side of the plurality of layers of Si-based circuitry

914

Bond the plurality of layers of WBG-based circuitry to a back-side of the plurality of layers of Si-based circuitry

915

The plurality of layers of WBG-based circuitry may comprise a wafer-scale WBG-based IC and the plurality of layers of Si-based circuitry comprises a wafer-scale Si-based IC

916

Provide a cooling structure operable to remove heat from the WBG-based circuitry and the Si-based circuitry to achieve an operating temperature at or below -25°C

FIG. 9B

SILICON CARBIDE POWER DEVICES INTEGRATED WITH SILICON LOGIC DEVICES

BACKGROUND

An integrated circuit may include a variety of power and logic devices. There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on. In particular, there is an ongoing desire to improve power and logic device structures that are included in or otherwise support operation of integrated circuits. It is with respect to these and other considerations that the present improvements have been needed. Such improvements may become critical as the desire to improve computational efficiency become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings:

FIGS. 9A and 9B illustrates various processes or methods for forming WBG-based circuitry integrated with Si-based circuitry on an IC device;

DETAILED DESCRIPTION

Figure 1:
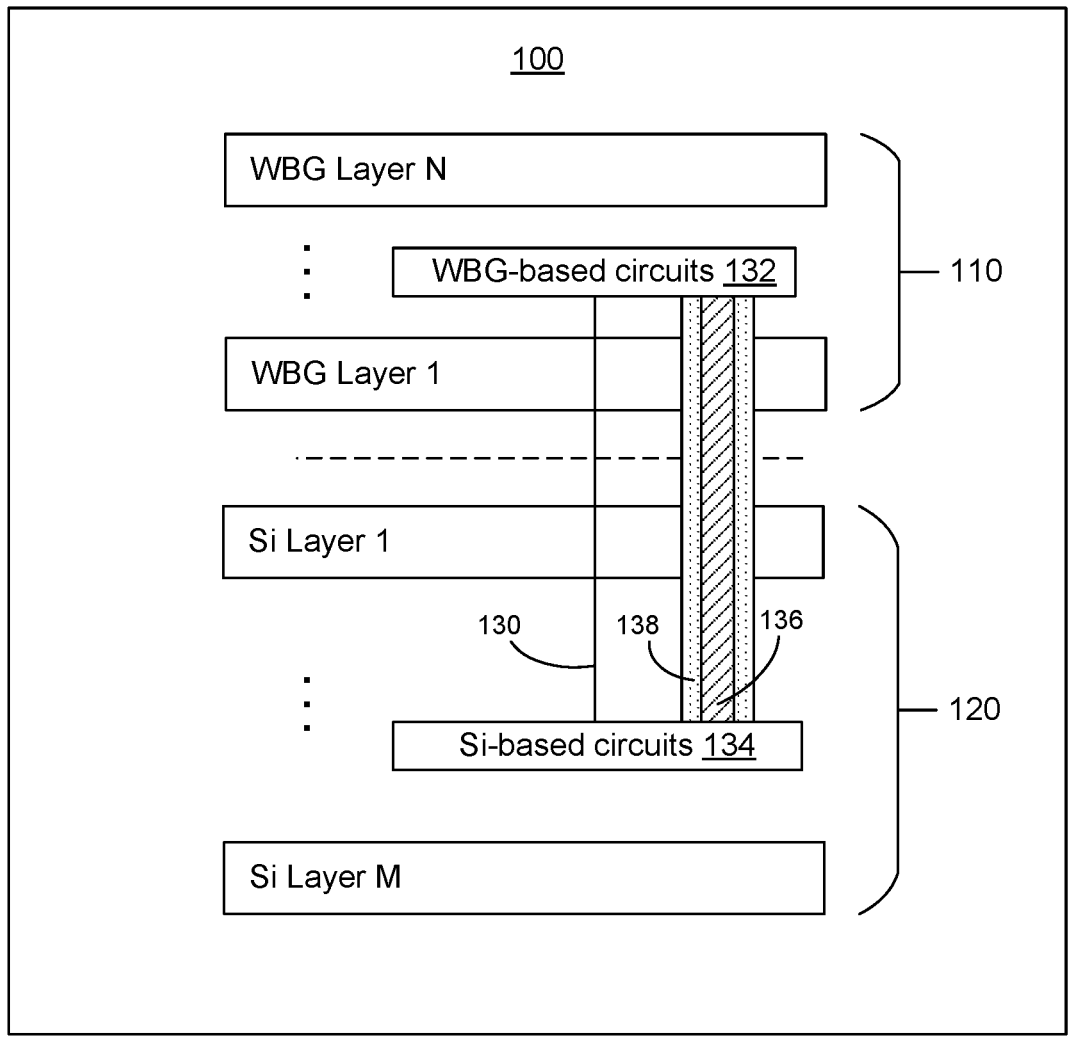
FIG. 1 illustrates a block diagram side view of an example integrated circuit (IC) device that includes wide bandgap (WBG) circuitry integrated with silicon (Si) circuitry.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure. The term "aligned" (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve integration of power and logic devices in integrated circuit (IC) devices. Silicon (Si) is a common material that provides a substrate or base material for many semiconductor wafers. When synthesized in a pure form, Si forms a crystalline structure where a single Si atom forms a bond with four other adjacent Si atoms. This crystalline Si base/substrate may then be doped with various other elements to form semiconductor junctions on a wafer of the Si base/substrate. Si wafers grow up to twelve (12) inches and form from a molten phase of pure Si.

Silicon carbide (SiC), on the other hand, is a wide bandgap (WBG) material that is a blend of Si and carbon (C) atoms that forms a variety of crystalline structures (e.g., 3C, 4C, and 6H SiC structures have all been adopted for use in semiconductor processing), all of which have different electrical properties and advantages when doped with various elements. SiC generally synthesizes from a vapor phase and SiC wafers can grow up to six (6) inches. Examples of other WBG materials include gallium nitride (GaN), gallium carbide (GaC), gallium oxide (GaO), zinc oxide (ZnO), indium oxide (InO), zinc nitride (ZnN), indium nitride (InN), etc.

The material structure is different between a Si substrate and a WBG-based substrate. The atom's valence band and conduction band have fixed energy levels. The difference in energy between these two bands may be referred to as the bandgap, measured in electron volts (eV). For example, Si's bandgap ranges from about 1 eV to about 1.5 eV, while, SiC's bandgap ranges from about 2.3 eV to about 3.3 eV. While the higher bandgap makes it more difficult for electrons in WBG materials to move to the conduction band, the higher bandgap also allows for WBG materials to withstand much higher electric fields as compared to Si (e.g., about ten times higher).

Given its ability to withstand higher electric fields, WBG substrate or base materials can withstand higher voltages before breaking down. For example, Si may have a breakdown voltage of about six hundred volts (600V), while SiC may have a breakdown voltage of about 3000V to 6000V (e.g., five to ten times higher). In practice, both Si and WBG materials have different advantages and disadvantages. For example, WBG materials may enable higher power applications as compared to Si, while Si generally has lower manufacturing costs as compared to WBG materials. There may be some problems with integrating Si technology with some WBG-based technology. One problem is that some WBG material formation utilizes high temperature. Another problem is that WBG materials are not integrated with Si monolithically. Some embodiments may overcome one or more of the foregoing problems.

Some embodiments may provide technology for WBG-based power devices integrated with Si-based logic devices. For integration with Si-based devices, WBG-based devices may be transferred using a layer transfer process or a hybrid bonding process. For the layer transfer process, monolithic power devices may be directly connected to a cooling plate of Si-based device. For the hybrid bonding process, WBG-based devices may be hybrid bonded to Si. In some embodiments SiC may be preferred to other WBG materials (e.g., GaN) because SiC may have a better thermal expansion coefficient as compared to non-Si-based WBG materials (e.g., for integration with Si). Some embodiments may further provide technology for full wafer integration of a WBG-based wafer bonded to a Si wafer. Some embodiments may enable high voltage, high power applications to be well integrated with high density, low voltage circuitry. For example, a high bandwidth input/output (IO) implemented in Si may benefit from integration with high voltage repeaters implemented in WBG material to traverse long distances.

A wide variety of applications may benefit from a high voltage domain. WBG materials may work at very high voltages (e.g., 300 volts or more) and may be effectively utilized for a high efficiency, high voltage domain. Some embodiments bond a WBG-based wafer onto a Si wafer. In some embodiments, the WBG-based wafer may be bonded to a front-side of a Si wafer. Because some Si logic wafers may include power delivery from a back-side of the Si logic wafer, however, the WBG-based wafer may be bonded to the back-side of the Si logic wafer for power delivery. For example, the WBG-based wafer may include power electronic elements such as WBG-based transistors and so on.

In some implementations, the WBG-based device is bonded to the Si using a layer transfer process. For layer transfer, a blanket layer is first provided on the Si. The blanket material may be thermally bonded to the Si by pressing the blanket material against the Si and applying a suitable amount of temperature to affix the blanket layer to the Si. The blanket layer may be bonded to the front-side of the Si or to a back-side of the Si. At this point in the layer transfer process, no patterning of the WBG-based circuitry has been done. Thereafter, any suitable WBG material fabrication techniques may be utilized to form the WBG-based circuitry over the blanket layer. WBG-based through vias (TWBGVs) may be formed through the layers of WBG-based circuitry and the blanket layer to contact a conductive pad on the Si to make electrical connections between the WBG-based circuitry and the Si circuitry.

In some implementations, the WBG-based device is hybrid bonded to the Si. The layers of WBG material for the WBG-based circuitry and the layers of Si for the Si circuitry are separately formed using any suitable fabrication techniques for the different base/substrate materials. Metal layers or bonding pads are exposed on each of the wafers/die to be bonded. The metal layers/bonding pads from the two wafers/die are suitably aligned and hybrid bonded to each other to provide electrical connections between the WBG-based circuitry and the Si circuitry. The hybrid bonding may be front-to-front, front-to-back, or back-to-back. In some embodiments, the exposed metal/pad may correspond to an exposed surface of a TWBGV. For example, a TWBGV from a WBG-based transistor may connect to low voltage transistors at the back-side of the Si wafer/die. For a through-silicon-via (TSV) that goes through Si, the Si layer gets depleted and that sufficiently insulates the Si TSV. For a TWBGV that goes through WBG material, a thick layer of dielectric may be provided around the TWBGV to inhibit/prevent dielectric breakdown from the high voltage WBG material.

For hybrid bonding of WBG-based wafers with Si wafers, the WBG material may be sensitive to various stresses that causes significant bowing. In accordance with some embodiments, emphasis is given to flattening just one side of WBG-based wafer that is to be hybrid bonded to the Si wafer and the other side of the WBG-based wafer does not need to have a perfectly flat surface for the hybrid bonding process. Following the hybrid bonding, there may be a bow, a two-dimensional curve, or other imperfection on the surface of the WBG-based wafer opposite to the bonded WBG-based wafer surface.

Layer transfer bonding and hybrid bonding each have respective benefits. Layer transfer technology does not require alignment prior to bonding because the WBG-based technology is processed on the bonded blanket layer with high precision equipment and techniques that can readily align the WBG-based features to the Si features. Layer transfer bonding may be particularly beneficial for applications where the WBG-based feature sizes are relatively large (e.g., such as SiC power electronics). On the other hand, hybrid bonding may be more beneficial if the WBG-based features sizes are relatively small because as the WBG-based feature sizes get scaled down the WBG-based process temperature becomes higher. At some point, too high of a WBG-based process temperature will cause a problem with the Si material. With hybrid bonding, smaller feature sizes may be utilized in the WBG-based circuits because the WBG-based and Si substrates are pre-processed (e.g., separate from each other) prior to aligning and bonding the two materials.

Wafer-scale integration refers to a very large IC device built on an entire base material wafer. For individual die IC fabrication, a single large cylindrical piece of base material is produced and then cut into disks known as wafers. The wafers are then cleaned and polished in preparation for the fabrication process. Various processes are used to pattern and form various layers of the IC die. Multiple copies of these patterns are formed on the wafer in a grid fashion across the surface of the wafer (e.g., where the grid lines delineate the individual IC die/chips). The wafer is then cut apart to separate out the individual chips. The chips are then placed into packaging. There is significant cost involved with testing, cutting, and packaging the individual IC die/chips. Wafer-scale integration may reduce this cost, as well as improve performance, by building larger IC devices in a single package (e.g., IC devices as large as a full wafer).

Non-limiting high voltage high power applications for WBG materials and Si integration as described herein include super-die processors, super-die IC engines, wafer-scale processors, and wafer-scale IC engines. For a super-die processor/engine, instead of separating out each individual die of a wafer, multiple smaller die make up each super-die (e.g., generally tens, hundreds, or thousands of smaller die per super-die). For a wafer-scale processor/engine, the entire wafer may be a single die or, if the wafer nominally includes multiple die, the wafer is not otherwise diced or separated into multiple die. Power delivery may be a challenge for such super-die processors/engines and wafer-scale processors/engines. Some embodiments may integrate high power, high voltage compatible WBG material with the Si-based super-die/wafer to provide a large enough area of power for sufficient power delivery to the Si-based super-die/wafer.

IC devices, systems, circuits, and techniques are described herein may also relate to integration of WBG-based power and Si devices for ultra-low voltage operation of the Si devices. Such WBG-based and Si devices may be operable at very low temperatures for improved device performance. For example, at low temperatures WBG material's efficiency may increase substantially.

Techniques discussed herein provide advantageous Si logic devices for low voltage applications, including complementary metal oxide semiconductor field effect transistors (CMOS FETs) such as FinFETs. In some embodiments, such low voltage applications are deployed at very low temperatures, such as, at or below 0° C. For example, the Si logic devices may be deployed in an IC device including or coupled to cooling structure operable to remove heat from the IC device to achieve an operating temperature at the very low temperature. As used herein, the term cooling structure or active cooling structure indicates a device that uses power to provide cooling (e.g., via flow of a coolant, immersion in a coolant, etc.). Notably, the cooling structure or active cooling structure need not be in operation to be labeled as such. The active cooling structure may be part of the IC device, provided separate from the IC device, or both. In some contexts, an active cooling structure is not needed as the IC device is deployed in a very low temperature environment such as in any of a subpolar oceanic climate, a subarctic climate, an arctic climate, a tundra climate, an ice cap climate, or any other environment of sustained cold temperatures.

In deployment at very low temperatures, WBG-based and Si devices using such materials systems have suitable behavior and reliability. Therefore, such WBG-based and Si devices may advantageously be deployed as various circuits/devices including super-die processors/engines, wafer-scale processors/engines, etc. In some embodiments, the WBG-based devices are used for power delivery and the Si logic devices are used at very low voltage. In some implementations, the term very low voltage indicates a voltage of not more than 50 mV, although lower voltages may be used such as voltages of not more than 10 mV. In some embodiments, the Si logic devices are integrated with CMOS FETs such as CMOS FinFETs. Notably, after fabrication of the Si logic devices over a first substrate, the Si logic devices may be layer transferred to a second substrate such as a silicon substrate and the CMOS FETs may be fabricated in an exposed portion of the silicon substrate either on the same side as the Si logic devices or on an opposite side of the Si logic devices. The Si logic devices and CMOS FETs are then integrated into circuits that advantageously use both transistor types at very low temperature.

As discussed, an IC device including WBG-based devices and Si logic devices (e.g., including CMOS FETs such as FinFETs) may be deployed in a very low temperature context. In some embodiments, the operating temperature of the IC device is maintained at or below 0° C. In some embodiments, the operating temperature of the IC device is maintained at or below about –196° C. (i.e., using liquid nitrogen as the coolant). In some embodiments, the operating temperature of the IC device is maintained at or below about –25° C. In some embodiments, the operating temperature of the IC device is maintained at or below about –50° C. In some embodiments, the operating temperature of the IC device is maintained at or below about –70° C. In some embodiments, the IC device is maintained at or below about –100° C. Other temperatures may be used based on coolant, environment, and so on. Other temperatures may be used based on coolant, environment, and so on. In operation at such very low temperatures, the WBG-based devices have improved efficiency, and the Si logic devices see a substantial boost in performance relative to operation at higher temperatures inclusive of increased carrier mobility, reduced contact resistance, and reduced leakage.

FIG. 1 shows an illustrative block diagram side view of an example integrated circuit (IC) device 100 that includes WBG-based devices integrated with Si-based devices in accordance with some embodiments. The IC device 100 may correspond to an individual IC die, a group of IC die, a super-die, or may correspond to a wafer-scale IC device (e.g., a full wafer). The IC device 100 includes a plurality of layers 110 of WBG-based circuitry, and a plurality of layers 120 of silicon Si-based circuitry monolithically bonded to the plurality of layers 110 of WBG-based circuitry, with one or more electrical connections 130 between respective WBG-based circuits 132 in the plurality of layers 110 of WBG-based circuitry and Si-based circuits 134 in the plurality of layers 120 of Si-based circuitry. In some embodiments, the plurality of layers 120 of Si-based circuitry may be hybrid bonded to the plurality of layers 110 of WBG-based circuitry. In some embodiments, the plurality of layers 120 of Si-based circuitry may be layer transfer bonded to the plurality of layers 120 of WBG-based circuitry.

In some embodiments, the IC device 100 may include a through-WBG via (TWBGV) 136 through one or more layers of the plurality of layers 110 of WBG-based circuitry to provide at least one of the one or more electrical connections between respective WBG-based circuits 132 and Si-based circuits 134. In some embodiments, the IC device 100 may further include dielectric material 138 that surrounds the TWBGV 136, where the dielectric material 138 has sufficient thickness to inhibit a breakdown of the dielectric material 138.

In some embodiments, the plurality of layers 110 of WBG-based circuitry may be bonded to a front-side of the plurality of layers 120 of Si-based circuitry. In some embodiments, the plurality of layers 110 of WBG-based circuitry may be bonded to a back-side of the plurality of layers 120 of Si-based circuitry. In some embodiments, the IC device 100 may include another plurality of layers of WBG-based circuitry such that the WBG-based layers may be bonded to both sides of the plurality of layers 120 of Si-based circuitry. In some embodiments, the plurality of layers 110 of WBG-based circuitry may comprise a wafer-scale WBG-based IC and the plurality of layers 120 of Si-based circuitry may comprise a wafer-scale Si-based IC.

In some embodiments, the IC device 100 may further include a plurality of microchannels in the IC device 100 and over the WBG and Si layers 110, 120, the microchannels to convey a heat transfer fluid therein. In some implementations, the IC device 100 may be thermally coupled to a cooling structure operable to remove heat from the IC device 100 to achieve an operating temperature at or below –25° C.

Figure 2:
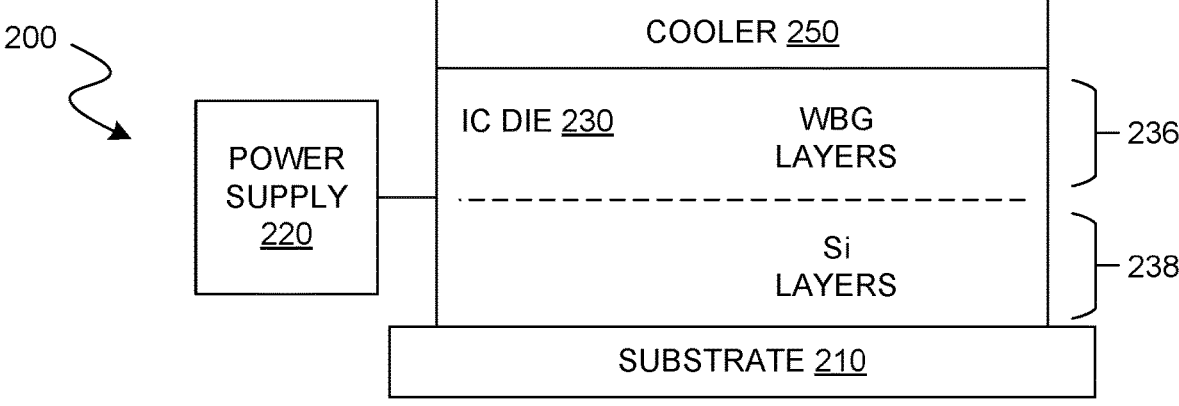
FIG. 2 illustrates a block diagram of an example of a system.

FIG. 2 shows a block diagram view of an example of a system 200 that includes a substrate 210, a power supply 220, and an IC die 230 attached to the substrate 210 and coupled to the power supply 220. The IC die 230 may include WBG layers 236 monolithically bonded to Si layer 238. The IC die 230 may be similarly configured as any of the various ICs described herein including, for example, the IC device 100 (FIG. 1), IC device 400 (FIG. 4), IC device 500 (FIG. 5), and IC device 702 (FIG. 7), where the IC devices are individual IC die. Any suitable substrate technology may be utilized for the substrate 210 including, for example, the substrates described herein in connection with FIGS. 7 and 8 (e.g., substrate 805). In some embodiments, the IC die 230 may be coupled to the power supply 220 through the substrate 210.

In some embodiments, the system 200 may further include a cooler 250 (e.g., a cooling structure) operable to remove heat from the IC die 230 to achieve an operating temperature at or below 0° C. (e.g., or at or below –25° C.). For example, the IC die 230 may comprise a plurality of metallization layers over front and back sides of the WBG-based and Si-based layers, the metallization layers to provide signal routing for the WBG-based and Si-based circuits, and the cooler 250 is over the plurality of metallization layers. In some embodiments, the cooler 250 may include a plurality of microchannels in the IC die 230 and over the plurality of metallization layers, the microchannels to convey a heat transfer fluid therein. In some embodiments, the cooler 250 may further include a chiller mounted to the IC die 230 over the microchannels, the chiller comprising one of a solid body comprising second microchannels to convey a second heat transfer fluid therein or a heat sink for immersion in a low-boiling point liquid. In some embodiments, the cooler 250 may be configured to convey liquid nitrogen to achieve an operating temperature at or below about –196° C.

Figure 3:
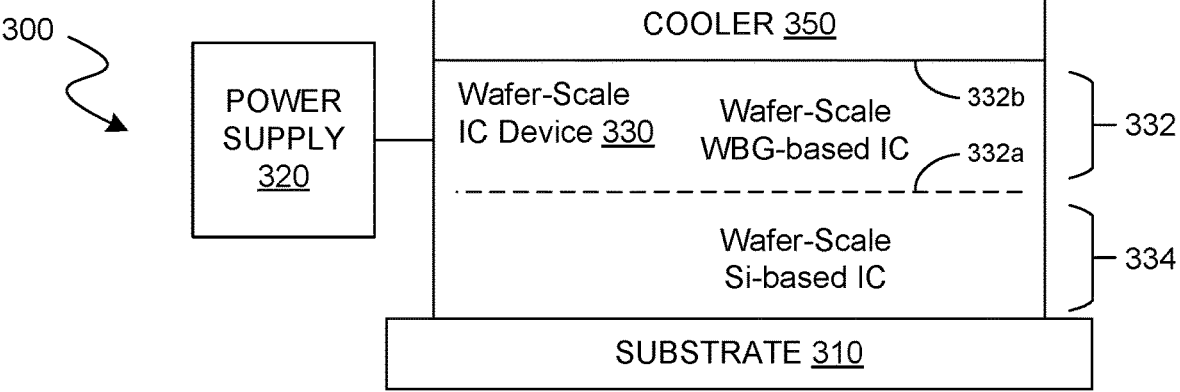
FIG. 3 illustrates a block diagram of another example of a system.

FIG. 3 shows a block diagram view of an example of a system 300 that includes a substrate 310, a power supply 320, and a wafer-scale IC device 330 attached to the substrate 310 and coupled to the power supply 320. The IC device 330 may be similarly configured as any of the various ICs described herein including, for example, the IC device 100 (FIG. 1), IC device 400 (FIG. 4), IC device 500 (FIG. 5), and IC device 702 (FIG. 7), where the IC devices are wafer-scale device. Any suitable substrate technology may be utilized for the substrate 310 including, for example, the substrates described herein in connection with FIGS. 7 and 8 (e.g., substrate 805). In some embodiments, the IC device 330 may be coupled to the power supply 320 through the substrate 310.

In some embodiments, the IC device 330 may have a wafer-scale WBG-based IC 332 coupled to the power supply 320, and a wafer-scale Si-based IC 334 monolithically bonded to the wafer-scale WBG-based IC 332, with one or more electrical connections between respective WBG-based circuits in the wafer-scale WBG-based IC 332 and Si-based circuits in the wafer-scale Si-based IC 334. For example, a power device on the wafer-scale WBG-based IC 332 may be coupled to a logic device on the wafer-scale Si-based IC 334. In some embodiments, the wafer-scale WBG-based IC 332 may be hybrid bonded to the wafer-scale Si-based IC 334. For example, a first side 332a of the wafer-scale WBG-based IC 332 may be hybrid bonded to the wafer-scale Si-based IC 334 and a second side 332b of the wafer-scale Si-based IC, opposite to the first side of wafer-scale WBG-based IC, has a non-flat surface (e.g., bowed, curved, non-uniform, uneven, etc.). In some embodiments, the wafer-scale WBG-based IC 332 may be layer transfer bonded to the wafer-scale Si-based IC 334. The wafer-scale WBG-based IC 332 may be bonded to a front-side or a back-side of the wafer-scale Si-based IC 334 (e.g., or two wafer-scale WBG-based ICs may be respectively bonded to both sides of the wafer-scale Si-based IC 334).

The IC device 330 may further include a TWBGV (not shown) through one or more layers of the wafer-scale WBG-based IC 332 to provide at least one of the one or more electrical connections between respective WBG-based circuits and Si-based circuits. For example, the IC device 330 may further include dielectric material that surrounds the TWBGV, where the dielectric material has sufficient thickness to inhibit a breakdown of the dielectric material.

The system 300 may further include a cooling structure 350 operable to remove heat from the wafer-scale WBG-based IC 332 and the wafer-scale Si-based IC 334 to achieve an operating temperature at or below 0° C. (e.g., or at or below −25° C.). In some embodiments, the cooling structure 350 further comprises a chiller mounted to the wafer-scale WBG-based IC 332 and the wafer-scale Si-based IC 334, the chiller comprising one of a solid body comprising microchannels to convey a heat transfer fluid therein or a heat sink for immersion in a low-boiling point liquid. In some embodiments, the cooling structure 350 may be configured to convey liquid nitrogen to achieve an operating temperature at or below about −196° C.

Figure 4:
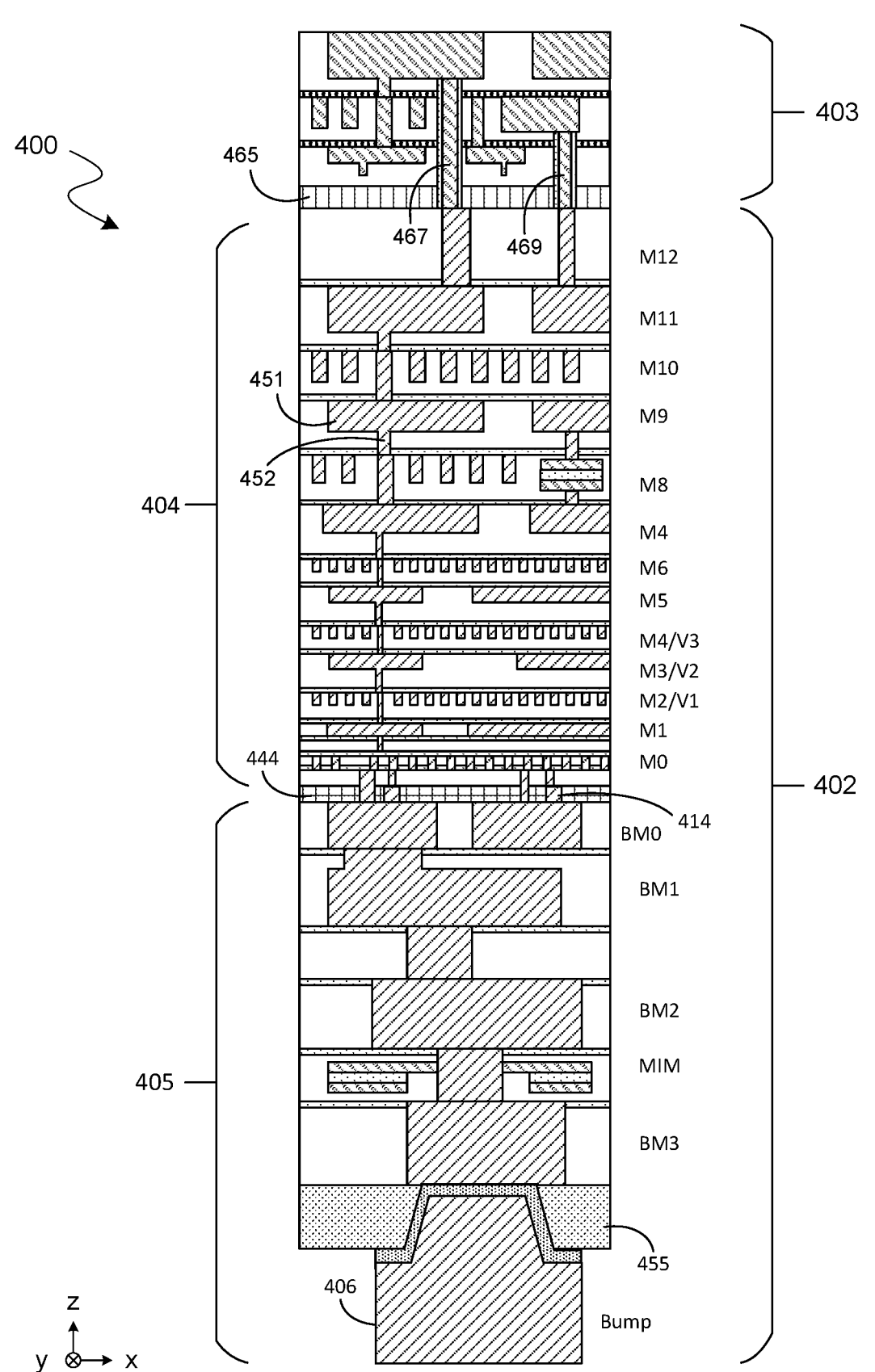
FIG. 4 illustrates a cross-sectional view of an example of an IC device that includes WBG power circuitry integrated with Si logic circuitry.

FIG. 4 illustrates a cross-sectional view of an example of an IC device 400 that includes WBG-based power circuitry integrated with Si logic circuitry in accordance with some embodiments. The IC device 400 includes Si-based IC layers 402 layer transfer bonded to WBG-based IC layers 403. IC device 400 includes a lateral surface along the x-y plane that may be defined or taken at any vertical position of IC device 400. The lateral surface of the x-y plane is orthogonal to a vertical or build-up dimension as defined by the z-axis. In some embodiments, a Si substrate is used to manufacture logic circuits and other transistors and components of Si-based IC layers 402. Suitable semiconductor substrates include, but are not limited to, single crystal silicon, polycrystalline silicon and silicon on insulator (SOI). The Si substrate may also include semiconductor materials, metals, dielectrics, dopants, and other materials commonly found in semiconductor substrates. In some embodiments, a WBG-based substrate is used to manufacture power electronics and other transistors and components of WBG-based IC layers 403. The WBG-based substrate may also include semiconductor materials, metals, dielectrics, dopants, and other materials commonly found in semiconductor substrates.

In FIG. 4, IC device 400 includes Si-based IC layers 402, which is a monolithic IC with Si-based logic circuits as described herein, including front-side metallization layers 404 (or front-side interconnect layers), and optional back-side metallization layers 405 (or back-side interconnect layers). The detailed structure of the Si-based circuitry is omitted from the cross-section of FIG. 4 to avoid obscuring the figure. In some embodiments, front-side metallization layers 404 provide signal routing to the non-planar transistors and back-side metallization layers 405 provide power delivery, as enabled by through-contacts 414, and vias. In some embodiments, IC device 400 further includes a package-level cooling structure (not shown), which may be deployed on or over the WBG-based layers 403 or on or over a back-side of Si-based IC layers 402. In some embodiments, Si-based IC layers 402 is deployed in a cold environment, formed using sufficiently conductive materials, etc. and an active-cooling structure is not used. IC device 400 may also be deployed without back-side metallization layers 405 shown in FIG. 4. In such embodiments, signal routing and power are provided to circuits of the Si-based IC layers 402 via front-side metallization layers 404. However, use of back-side metallization layers 405 may offer advantages.

The circuits of the Si-based IC layers 402 are connected and thermally coupled by metallization, e.g., metal heat spreader 444, to the entire metallization structure by through-contacts 414. In this way, circuits of the Si-based IC layers 402 are thermally coupled to both die-level active-cooling structures and package-level active-cooling structures.

Interconnectivity of transistors, signal routing to and from circuitry of the Si-based IC layers 402, vias, etc., power delivery to circuitry of the Si-based IC layers 402, etc., and routing to an outside device (not shown), is provided by front-side metallization layers 404, optional back-side metallization layers 405, and package-level interconnects 406. In the example of FIG. 4, package-level interconnects 406 are provided on or over a back-side of Si-based IC layers 402 as bumps over a passivation layer 455, and IC device 400 is attached to a substrate (and coupled to signal routing to, power delivery, etc.) by package-level interconnects 406. However, package-level interconnects 406 may be provided using any suitable interconnect structures such as bond pads, solder bumps, etc. Furthermore, in some embodiments, package-level interconnects 406 are provided on or over a front-side of WBG-based IC layers 403 and a package-level cooling structure is provided on or over a back-side of Si-based IC layers 402.

As used herein, the term "metallization layer" describes layers with interconnections or wires that provide electrical routing, generally formed of metal or other electrically and thermally conductive material. Adjacent metallization layers may be formed of different materials and by different methods. Adjacent metallization layers, such as metallization interconnects 451, are interconnected by vias, such as vias 452, that may be characterized as part of the metallization layers or between the metallization layers. As shown, in some embodiments, front-side metallization layers 404 are formed over and immediately adjacent transistors. The back-side is then the opposite side, which may be exposed during processing by attaching the front-side to a carrier wafer and exposing the back-side (e.g., by back-side grind or etch operations) as known in the art.

In the illustrated example, front-side metallization layers 404 include M0, V0, M1, M2/V1, M3/V2, M4/V3, and M4-M12. However, front-side metallization layers 404 may include any number of metallization layers such as eight or more metallization layers. Similarly, back-side metallization layers 405 include BM0, BM1, BM2, and BM3. However, back-side metallization layers 405 may include any number of metallization layers such as two to five metallization layers. Front-side metallization layers 404 and back-side metallization layers 405 are embedded within dielectric materials. Furthermore, optional metal-insulator-metal (MIM) devices such as diode devices may be provided within back-side metallization layers 405. Other devices such as capacitive memory devices may be provided within front-side metallization layers 404 and/or back-side metallization layers 405.

In FIG. 4, the IC device 400 includes a blanket layer 465 and the WBG-based IC layers 403 are monolithically built up on the blanket layer 465 through a layer transfer process. One or more TWBGVs, such as TWBGVs 467 and 469, are formed through one or more layers of the WBG-based IC layers 403 and the blanket layer 465 to provide electrical connections between Si-based circuitry and WBG-based circuitry. For example, the WBG-based circuitry may provide power electronics for Si-based logic circuits.

Figure 5:
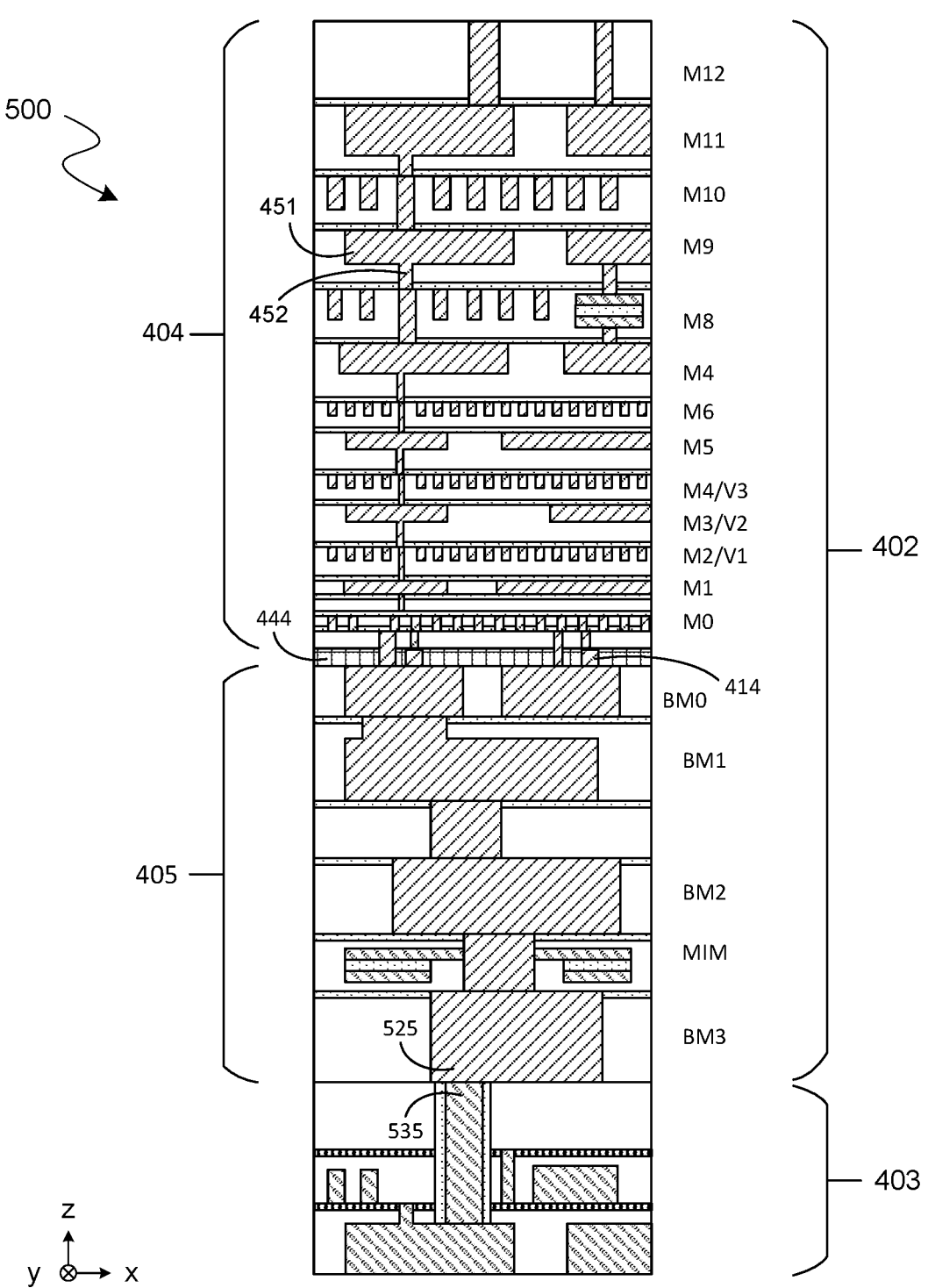
FIG. 5 illustrates a cross-sectional view of another example of an IC device that includes WBG power circuitry integrated with Si logic circuitry.

FIG. 5 illustrates a cross-sectional view of an example of an IC device 500 that includes WBG power circuitry integrated with Si logic circuitry in accordance with some embodiments. The IC device 500 may be similarly configured as the IC device 400, with like reference numerals indicating similar elements. The IC device 500 includes the Si-based IC layers 402 hybrid bonded to WBG-based IC layers 403.

In FIG. 5, the IC device 500 the Si-based IC layers 402 and the WBG-based IC layers 403 preprocessed separately and then exposed metal pads (e.g., an exposed surface of a metallization structure 525 in back-side metallization BM3 and an exposed surface of a TWBGV 535 in the WBG-based IC layers 403) are aligned and hybrid bonded to each other to provide electrical connections between Si-based circuitry and WBG-based circuitry. For example, the WBG-based circuitry may provide power electronics for Si-based logic circuits.

Figure 6:
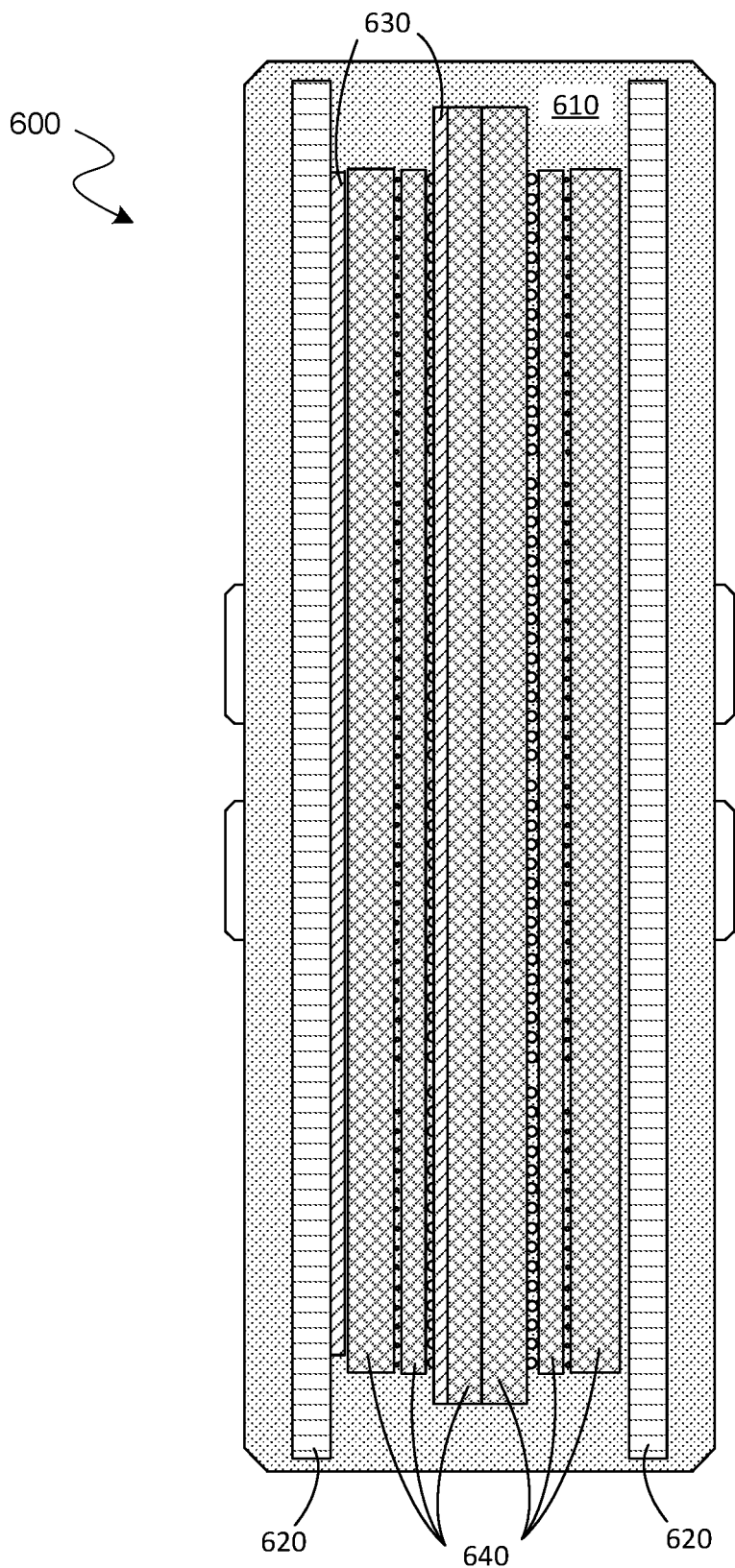
FIG. 6 illustrates a cross-sectional side view of an example of a wafer-scale IC system that uses WBG-based wafers integrated with Si-based wafers.

FIG. 6 illustrates a cross-sectional side view of an example of a wafer-scale IC system 600 that uses SiC-based wafers integrated with Si-based wafers, as described herein. The IC system 600 includes an enclosure 610 that houses one or more cooling structures 620, SiC-based wafers 630, and Si-based wafers 640, arranged as shown. The SiC-based wafers 630 are monolithically bonded to respective ones of the Si-based wafers 640. In some implementations, external power and signals connections (not shown) may be brought in through the enclosure 610 to the SiC-based wafers 630 and/or the Si-based wafers 640. For example, the Si-based wafers 640 may include super-computer level processing with extremely large amounts of memory. The IC system 600 may further include optical connections and components to handle high bandwidth IO for the system 600. The SiC-based wafers 630 may provide wafer level power delivery for the IC system 600. The cooling structure(s) 620 may include one or more cooling plates, that may further include active cooling technology.

In some embodiments, ICs with WBG-based die/wafers integrated with Si-based die/wafers may be integrated into a low-temperature system. Lower temperatures enhance conduction in many materials and can enable the use of, e.g., different materials and structures (such as smaller transistor channels). A number of structures may be used to lower the system temperature and so allow for the use of, e.g., smaller conducting structures. Active cooling structures can be used to lower system temperatures to below ambient temperature, even to well below ambient temperature. Active cooling structures can include thermoelectric coolers. In some embodiments, active cooling structures include stacks of alternating p- and n-type semiconductor materials. In some embodiments, active cooling structures flow cooling fluids through channels, including microchannels, thermally coupled to IC packages. In some embodiments, active cooling structures include channels thermally coupled to IC die/devices/systems 100, 230, 330, 400, 500, 600. In some embodiments, active cooling structures include channels on one or more sides of IC die/devices/systems 100, 230, 330, 400, 500, 600. In some embodiments, active cooling structures include channels within IC die/devices/systems 100, 230, 330, 400, 500, 600. In some embodiments, active cooling structures include two-phase cooling. In some embodiments, active cooling structures include low-boiling-point fluids. In some embodiments, active cooling structures include refrigerants as cooling fluids. In some embodiments, active cooling structures lower system temperatures to below 0° C.

Figure 7:
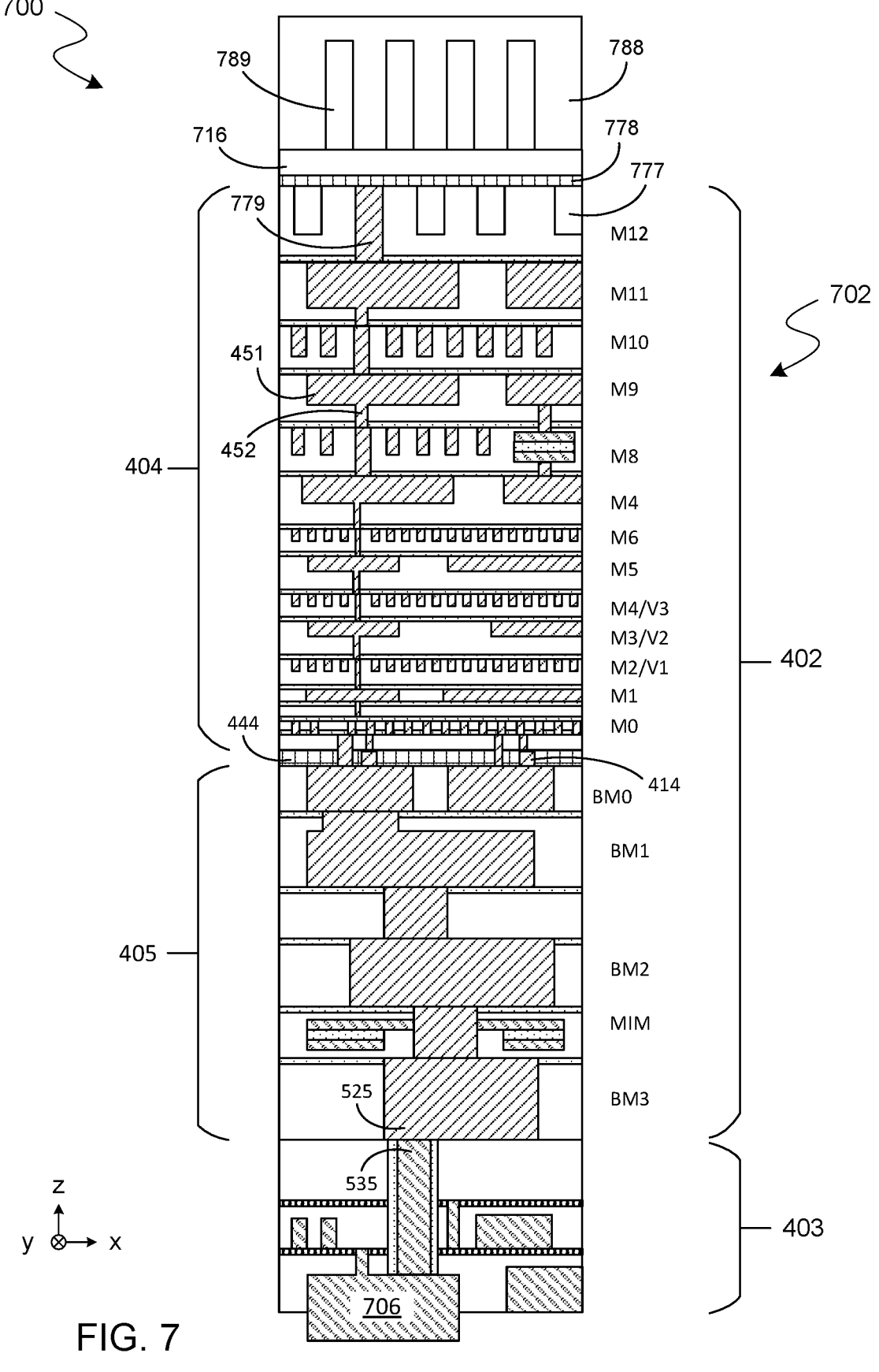
FIG. 7 illustrates a cross-sectional view of a low-temperature IC system with WBG-based circuitry integrated with Si-based circuitry, using die- and package-level active cooling.

FIG. 7 illustrates a cross-sectional view of a low-temperature IC system 700 using die- and package-level active cooling, that includes WBG power circuitry integrated with Si logic circuitry in accordance with some embodiments. The IC system 700 includes an IC device 702 that may be similarly configured as the IC device 500, with like reference numerals indicating similar elements. In the example of IC system 700, IC device 702 includes active-cooling structures or components as provided by both die-level microchannels 777 and package-level active-cooling structure 788.

In FIG. 7, IC system 700 includes an IC device 702, which is a monolithic IC with WBG-based IC layers 403 hybrid bonded to Si-based IC layers 402 as described herein. In some embodiments, IC system 700 further includes a package-level cooling structure 788, which may be deployed on or over front-side metallization layers 404 (as shown) or on or over a back-side of IC device 702. In some embodiments, package-level cooling structure 788 is coupled to IC device 702 by an adhesion layer 716. IC system 700 may also be deployed without back-side metallization layers 405 shown in FIG. 7. In such embodiments, signal routing and power are provided to circuits of the IC device 702 via front-side metallization layers 404. However, use of back-side metallization layers 405 may offer advantages.

The circuits of the IC device 702 are connected and thermally coupled by metallization, e.g., metal heat spreader 444, to the entire metallization structure by through-contacts 414. In this way, circuits of the IC device 702 are thermally coupled to both the die-level active-cooling structures (of die-level microchannels 777) and package-level active-cooling structure 788.

Interconnectivity of transistors, signal routing to and from circuitry of the IC device 702, vias 452 (e.g., and other vias), etc., power delivery to circuitry of the IC device 702, etc., and routing to an outside device (not shown), is provided by front-side metallization layers 404, optional back-side metallization layers 405, and package-level interconnects 706. In the example of FIG. 7, package-level interconnects 706 are provided on or over a back-side of IC device 702 as bumps over a passivation layer (not shown), and IC system 700 may be attached to a substrate (and coupled to signal routing to, power delivery, etc.) by package-level interconnects 706. However, package-level interconnects 706 may be provided using any suitable interconnect structures such as bond pads, solder bumps, etc. Furthermore, in some embodiments, package-level interconnects 706 are provided on or over a front-side of IC device 702 (i.e., over front-side metallization layers 404) and package-level cooling structure 788 is provided on or over a back-side of IC device 702.

In IC system 700, IC device 702 includes die-level, active-cooling as provided by die-level microchannels 777. Die-level microchannels 777 are to convey a heat transfer fluid therein to remove heat from IC device 702. The heat transfer fluid may be any suitable liquid or gas. In some embodiments, the heat transfer fluid is liquid nitrogen operable to lower the temperature of IC device 702 to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term "microchannels" indicates a channel to convey a heat transfer fluid with the multiple microchannels providing discrete separate channels or a network of channels. Notably, the plural microchannels does not indicate separate channel networks are needed. Such die-level microchannels 777 may be provided in any pattern in the x-y plane such as serpentine patterns, patterns of multiple parallel die-level microchannels 777, or the like. Die-level microchannels 777 couple to a heat exchanger (not shown) that removes heat from and cools the heat transfer fluid before re-introduction to die-level microchannels 777. The flow of fluid within die-level microchannels 777 may be provided by a pump or other fluid flow device. The operation of the heat exchanger, pump, etc. may be controlled by a controller.

In the illustrated embodiment, die-level microchannels 777 are implemented at metallization level M12. In other embodiments, die-level microchannels 777 are implemented over metallization level M12. Die-level microchannels 777 may be formed using any suitable technique or techniques such as patterning and etch techniques to form the void structures of die-level microchannels 777 and passivation or deposition techniques to form a cover structure 778 to enclose the void structures. As shown, in some embodiments, the die-level, active-cooling structure of IC system 700 includes a number of die-level microchannels 777 in IC device 702 and over a number of front-side metallization layers 404. As discussed, die-level microchannels 777 are to convey a heat transfer fluid therein. In some embodiments, a metallization feature 779 of metallization layer M12 is laterally adjacent to die-level microchannels 777. For example, metallization feature 779 may couple to a package-level interconnect structure (not shown) for signal routing for IC device 702. In some embodiments, a passive heat removal device such as a heat sink or the like may be used instead of or in addition to package-level cooling structure 788. In some embodiments, package-level cooling structure 788 is not deployed in IC system 700.

IC system 700 includes package-level active-cooling structure 788 having package-level microchannels 789. Package-level microchannels 789 are to convey a heat transfer fluid therein to remove heat from IC device 702. The heat transfer fluid may be any suitable liquid or gas as discussed with respect to die-level microchannels 777. Package-level microchannels 789 may be provided in any pattern in the x-y plane such as serpentine patterns, patterns of multiple parallel package-level microchannels 789, etc. Package-level microchannels 789 couple to a heat exchanger (not shown) that removes heat from and cools the heat transfer fluid before re-introduction to package-level microchannels 789. The flow of fluid within package-level microchannels 789 may be provided by a pump or other fluid-flow device. The operation of the heat exchanger, pump, etc. may be controlled by a controller. In the illustrated embodiment, package-level active-cooling structure 788 is a chiller mounted to IC device 702 such that the chiller has a solid body having microchannels therein to convey a heat transfer fluid.

In some embodiments, the heat-removal fluid deployed in die-level microchannels 777 and package-level active-cooling structure 788 are coupled to the same pump and heat exchanger systems. In such embodiments, the heat removal fluid conveyed in both die-level microchannels 777 and package-level active-cooling structure 788 are the same material. Such embodiments may advantageously provide simplicity. In other embodiments, the heat removal fluids are controlled separately. In such embodiments, the heat removal fluids conveyed by die-level microchannels 777 and package-level active-cooling structure 788 may be the same or they may be different. Such embodiments may advantageously provide improved flexibility.

As discussed, IC system 700 includes IC device 702 and optional die-level and package-level active-cooling structures operable to remove heat from IC device 702 to achieve a very low operating temperature of IC device 702. As used herein, the term "very low operating temperature" indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active-cooling structure may be provided as a package-level structure (i.e., separable from IC device 702), as a die-level structure (i.e., integral to IC device 702), or both. In some embodiments, IC device 702 is deployed in a cold environment, formed using sufficiently conductive materials, etc. and an active-cooling structure is not used.

Figure 8:
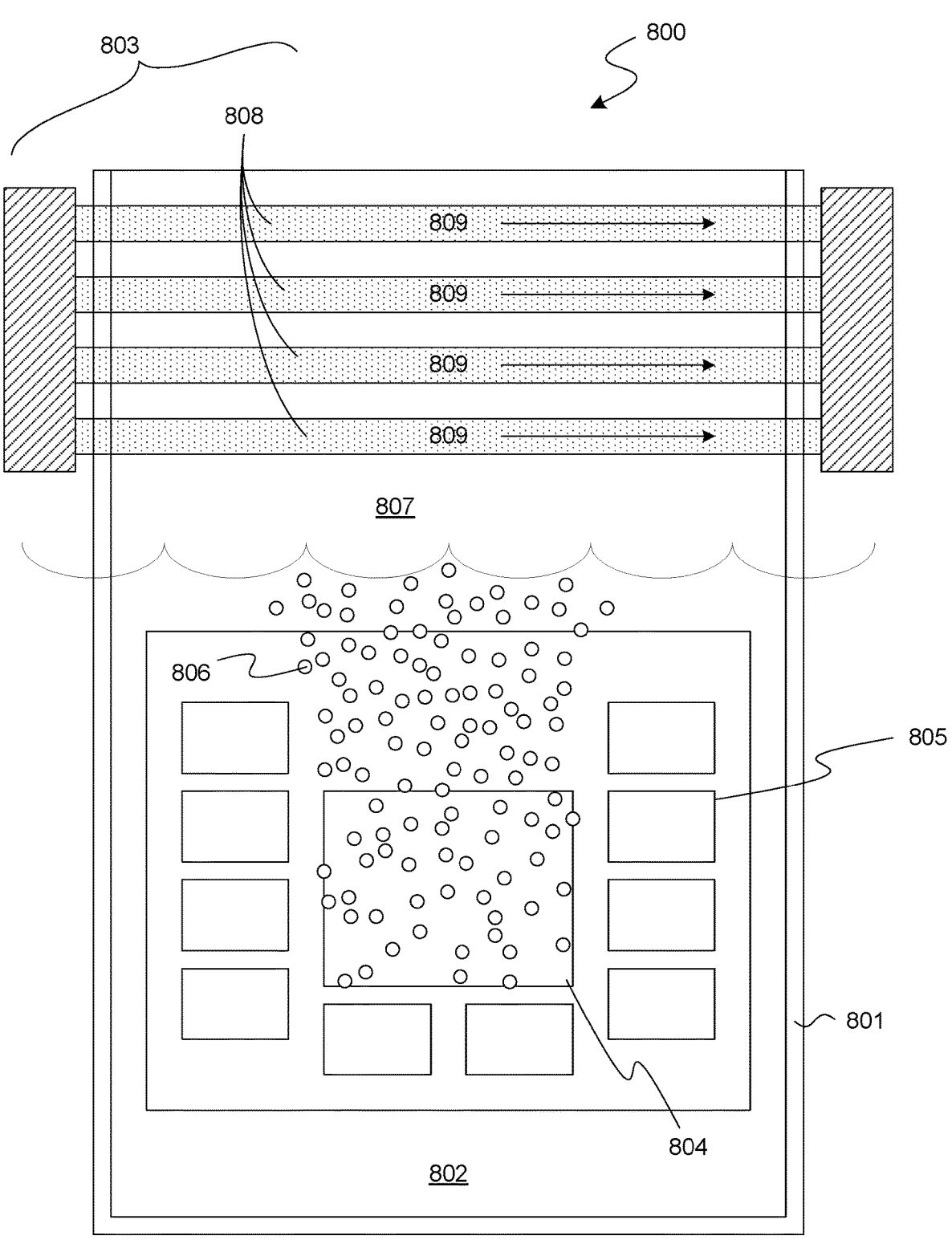
FIG. 8 illustrates a view of an example two-phase immersion cooling system for low-temperature operation of an IC device.

FIG. 8 illustrates a view of an example two-phase immersion cooling system 800 for low-temperature operation of an IC device, in accordance with some embodiments. As shown, two-phase immersion cooling system 800 includes a fluid containment structure 801, a low-boiling point liquid 802 within fluid containment structure 801, and a condensation structure 803 at least partially within fluid containment structure 801. As used herein, the term "low-boiling point liquid" indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 804, such as an IC package including any of IC devices or systems 100, 200, 300, 400, 500, 600, 700 as discussed herein is immersed in low-boiling point liquid 802. In some embodiments, IC devices or systems 100, 200, 300, 400, 500, 600, 700 as deployed in two-phase immersion cooling system 800 do not include additional active cooling structures, although such die-level or package-level active cooling structures may be used in concert with two-phase immersion cooling system 800. In some embodiments, when deployed in two-phase immersion cooling system 800, package-level active-cooling structure 788 is a heat sink, a heat dissipation plate, a porous heat dissipation plate or the like.

Notably, IC device 702 (or IC die/device/system 100, 200, 300, 400, 500, 600, 700), is the source of heat in the context of two-phase immersion cooling system 800. For example, IC device 702 may be packaged and mounted on electronics substrate 805. Electronic substrate 805 may be coupled to a power supply (not shown) and may be partially or completely submerged in low-boiling point liquid 802.

In operation, the heat produced by heat generation source 804 vaporizes low-boiling point liquid 802 as shown in vapor or gas state as bubbles 806, which may collect, due to gravitational forces, above low-boiling point liquid 802 as a vapor portion 807 within fluid containment structure 801. Condensation structure 803 may extend through vapor portion 807. In some embodiments, condensation structure 803 is a heat exchanger having a number of tubes 808 with a cooling fluid (i.e., a fluid colder than the condensation point of vapor portion 807) shown by arrows 809 that may flow through tubes 808 to condense vapor portion 807 back to low-boiling point liquid 802. In the IC system of FIG. 8, package-level active-cooling structure 788 includes a passive cooling structure such as a heat sink for immersion in low-boiling point liquid 802.

Figure 9A:
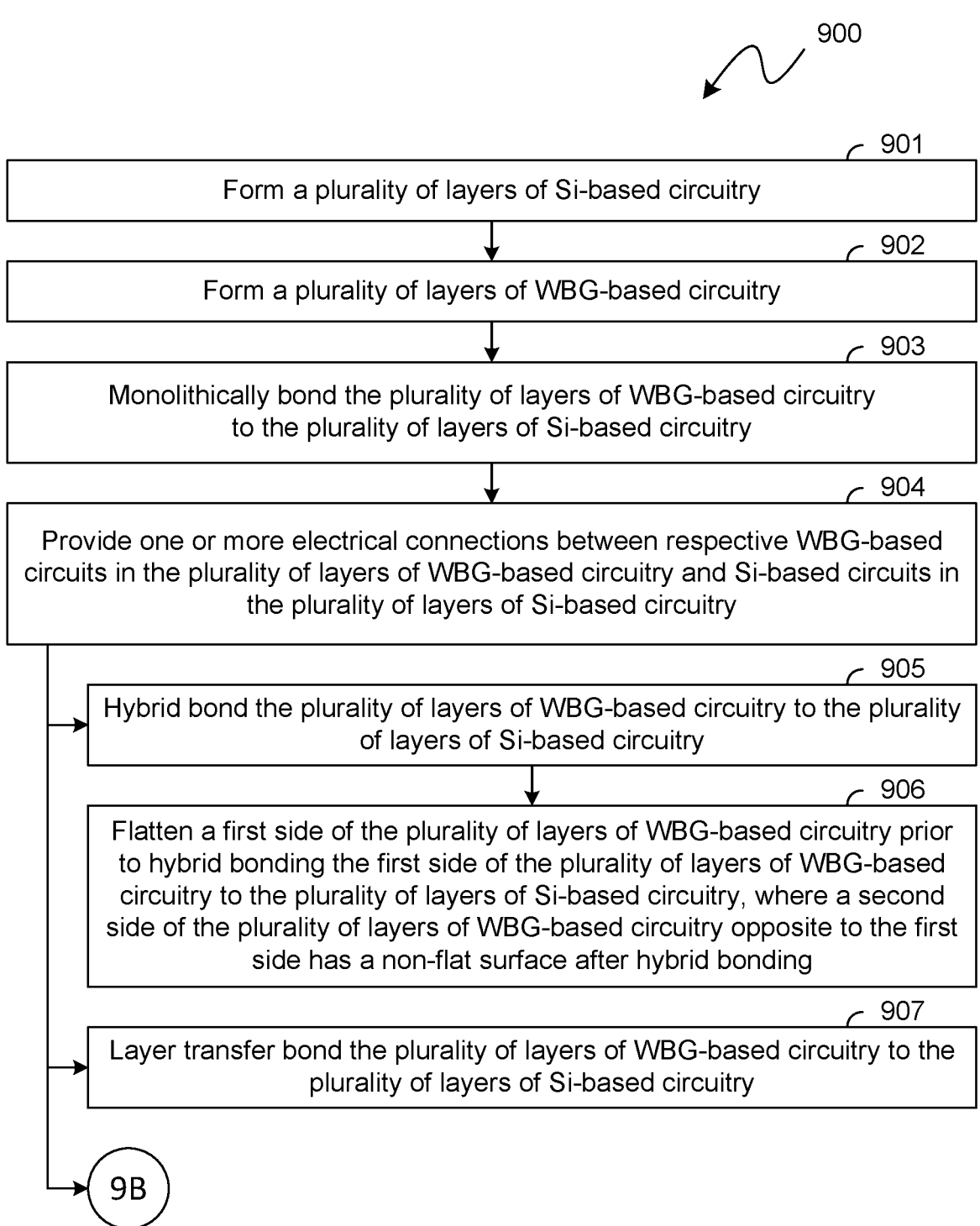

FIG. 9A illustrates various processes or methods 900 for integrating WBG-based circuits and Si-based circuits on an IC device, in accordance with some embodiments. FIG. 9A to 9B show methods 900 that include operations 901-916. Some operations shown in FIGS. 9A and 9B are optional. FIGS. 9A and 9B show an example sequence, but the operations can be done in other sequences as well, and some operations may be omitted. Some operations can also be performed multiple times before other operations are performed. Some operations may be included within other operations. Methods 900 generally entail monolithically bonding WBG-based structures with Si-based structures.

Prior to operation 901, a Si substrate is received. The Si substrate is a planar platform and may already include dielectric and metallization structures. The Si substrate may be one of many layers in an IC device, and may itself have many layers. The Si substrate may be above other layers in the IC device (all or of a portion of which may be subsequently removed in back-side metallization contexts), and other layers may subsequently be formed in or over the substrate. In some embodiments, Si-based logic circuits will be formed on a front-side of the substrate. In some embodiments, Si-based logic circuits will be formed on a back-side. In some embodiments, Si-based logic circuits will be formed on both sides.

Transistors in the front-side or back-side metallization layers can be formed from the same material as the Si substrate or, e.g., deposited on the Si substrate. In some embodiments, the substrate is crystalline silicon and transistors in the Si-based metallization layers are formed by etching back the substrate to form transistor structures, e.g., non-planar structures, such as fins for access transistor channels. In some embodiments, transistors comprise polycrystalline silicon, which may be deposited over other materials. Other semiconductor materials may be deposited as well, on the substrate or over other structures on the substrate. Such semiconductor materials can be any material suitable for forming a transistor channel, e.g., for an access transistor, but some materials will be preferred for their manufacturing properties, e.g., the capability to be deposited easily, in a well-controlled manner, and in thin layers.

Forming the front-side or back-side metallization Si-based layers may include forming ultrathin structures, such as nanowires, nanoribbons, or nanosheets, for transistor channels. In some embodiments, one or a few monolayers of semiconductor materials are deposited over the substrate or other structures. In some embodiments, less than 2 nm of semiconductor material is deposited as a film. In some embodiments, a transition-metal dichalcogenide (TMD) material is deposited to form access transistors. TMDs can be 2D materials, e.g., forming monolayers of semiconductor materials. 2D materials may be deposited on structures, such as backbone features, deposited on the substrate.

The back-side metallization layers need not be formed before, e.g., other layers of the IC device. Forming the back-side metallization layers and other layers of the IC device may include forming transistors, resistors, and interconnections, e.g., between them and with external structures, including power, signal, data, ground, etc. lines. At least some of these structures may be conventional and known methods may be used.

The methods for forming transistors may vary with transistor function. TFTs for use as pull-up transistors may be formed as parasitic devices deposited over other structures in some layers. In some embodiments, forming transistors includes depositing amorphous or polycrystalline metal oxides. In some embodiments, a thin, metal-oxide film is deposited that may be semiconducting substantially as-deposited, and/or following some subsequent activation process, such as a thermal anneal.

Other structures, e.g., resistors and metallization, may also be deposited or otherwise formed from such materials, and such forming may be done throughout the forming operations of transistors and other structures. Pull-up resistors may be formed from the substrate material or, e.g., by depositing polycrystalline silicon or other material over the substrate. Other structures, e.g., access transistor gate electrodes, may be formed such that convenient connections can be made to associated structures in the first layer. Metallization may be formed before and after, and interleaved throughout, the forming of other structures.

In operation 901, a plurality of layers of Si-based circuitry are formed. In operation 902, a plurality of layers of WBG-based circuitry are formed. In operation 903, the plurality of layers of WBG-based circuitry are monolithically bonded to the plurality of layers of Si-based circuitry. In operation 904, one or more electrical connections are provided between respective WBG-based circuits in the plurality of layers of WBG-based circuitry and Si-based circuits in the plurality of layers of Si-based circuitry.

In some embodiments, at operation 905, the plurality of layers of WBG-based circuitry are hybrid bonded to the plurality of layers of Si-based circuitry. For example, in operation 906, a first side of the plurality of layers of WBG-based circuitry are flattened prior to hybrid bonding the first side of the plurality of layers of WBG-based circuitry to the plurality of layers of Si-based circuitry, where a second side of the plurality of layers of WBG-based circuitry opposite to the first side has a non-flat surface after hybrid bonding. In other embodiments, at operation 907, the plurality of layers of WBG-based circuitry are layer transfer bonded to the plurality of layers of Si-based circuitry (e.g., bonded through a layer transfer process).

In some embodiments, at operation 911, a TWBGV is formed through one or more layers of the plurality of layers of WBG-based circuitry to provide at least one of the one or more electrical connections between respective WBG-based circuits and Si-based circuits. In operation 912, dielectric material is formed that surrounds the TWBGV, where the dielectric material has sufficient thickness to inhibit a breakdown of the dielectric material.

In operation 913, the plurality of layers of WBG-based circuitry are bonded to a front-side of the plurality of layers of Si-based circuitry. In operation 914, the plurality of layers of WBG-based circuitry are bonded to a back-side of the plurality of layers of Si-based circuitry In operation 915, the plurality of layers of WBG-based circuitry may comprise a wafer-scale WBG-based IC and the plurality of layers of Si-based circuitry comprises a wafer-scale Si-based IC. In operation 916, a cooling structure is provided operable to remove heat from the WBG-based circuitry and the Si-based circuitry to achieve an operating temperature at or below −25° C.

Figure 10:
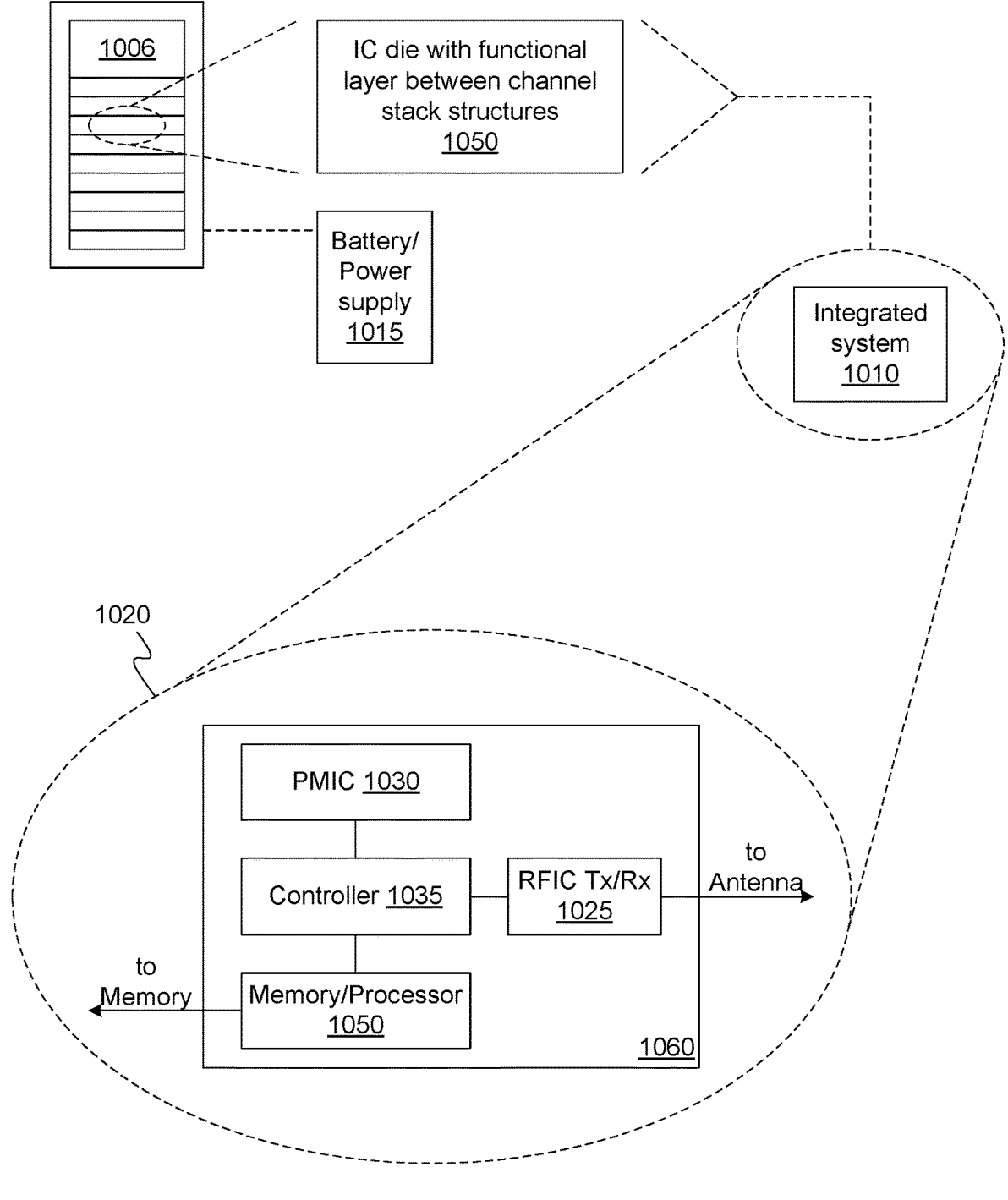
FIG. 10 illustrates a diagram of an example data server machine employing an IC device with WBG-based circuitry integrated with Si-based circuitry.

FIG. 10 illustrates a diagram of an example data server machine 1006 employing an IC device with WBG-based circuitry integrated with Si-based circuitry, in accordance with some embodiments. Server machine 1006 may be any commercial server, for example, including any number of high-performance computing platforms disposed within a rack and networked together for electronic data processing, which in the exemplary embodiment includes one or more devices 1050 having WBG-based circuitry integrated with Si-based circuitry.

Also as shown, server machine 1006 includes a battery and/or power supply 1015 to provide power to devices 1050, and to provide, in some embodiments, power delivery functions such as power regulation. Devices 1050 may be deployed as part of a package-level integrated system 1010. Integrated system 1010 is further illustrated in the expanded view 1020. In the exemplary embodiment, devices 1050 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1050 is a microprocessor including a cache memory. As shown, device 1050 may be a multi-chip module employing one or more IC devices with WBG circuits integrated with Si circuits, as discussed herein. Device 1050 may be further coupled to (e.g., communicatively coupled to) a board, an interposer, or a substrate 1060 along with, one or more of a power management IC (PMIC) 1030, RF (wireless) IC (RFIC) 1025, including a wideband RF (wireless) transmitter and/or receiver (TX/RX) (e.g., including a digital baseband and an analog front end module further comprises a power amplifier on a transmit path and a low noise amplifier on a receive path), and a controller 1035 thereof. In some embodiments, RFIC 1025, PMIC 1030, controller 1035, and device 1050 include IC devices having WBG-based circuitry integrated with Si-based circuitry on substrate 1060 in a multi-chip module.

Figure 11:
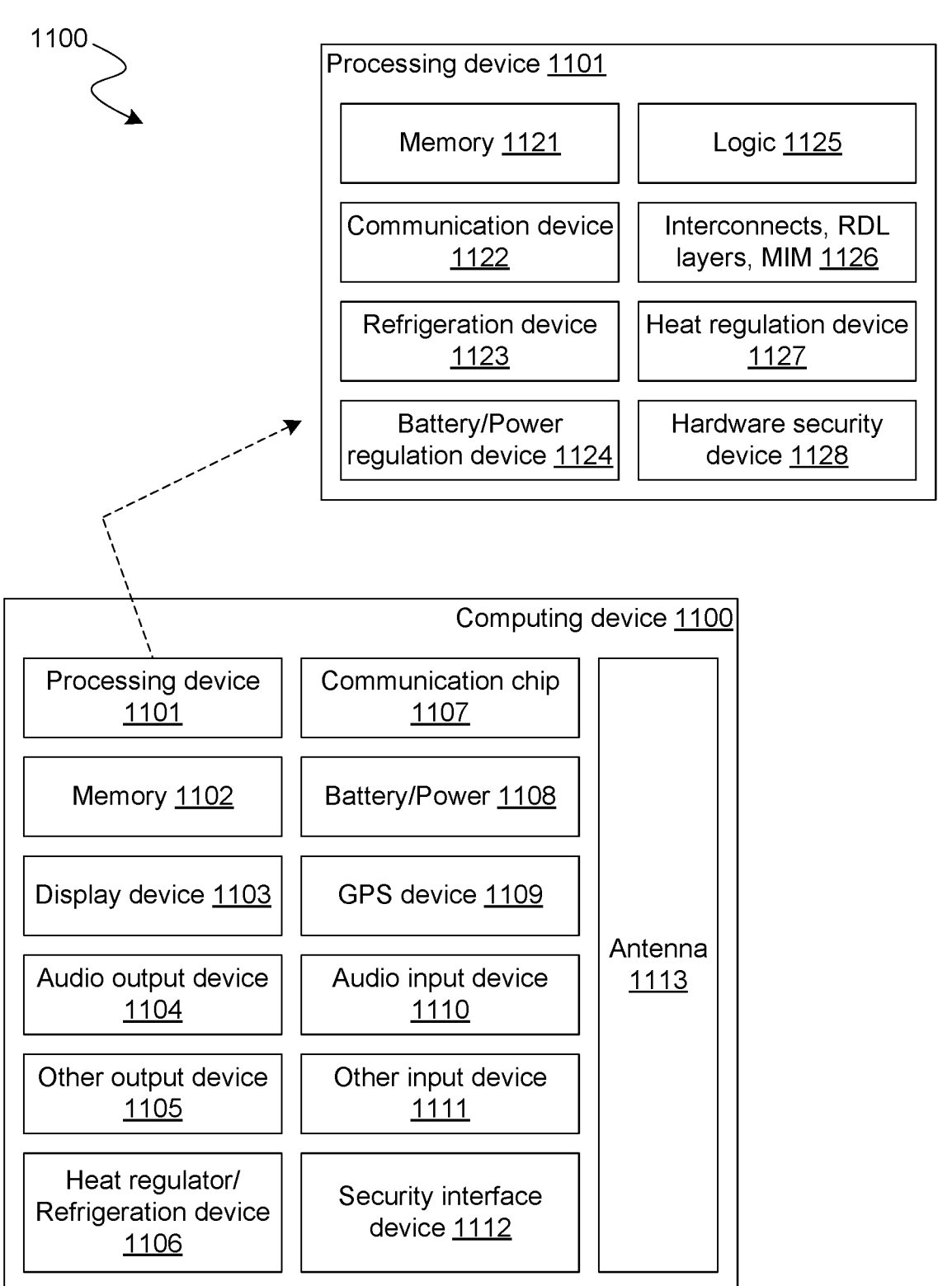
FIG. 11 is a block diagram of an example computing device, all in accordance with at least some implementations of the present disclosure.

FIG. 11 is a block diagram of an example computing device 1100, in accordance with some embodiments. For example, one or more components of computing device 1100 may include any of the devices or structures discussed herein. A number of components are illustrated in FIG. 11 as being included in computing device 1100, but any one or more of these components may be omitted or duplicated, as suitable for the application. In some embodiments, some or all of the components included in computing device 1100 may be attached to one or more printed circuit boards (e.g., a motherboard). In some embodiments, various ones of these components may be fabricated onto a single system-on-a-chip (SoC) die. Additionally, in various embodiments, computing device 1100 may not include one or more of the components illustrated in FIG. 11, but computing device 1100 may include interface circuitry for coupling to the one or more components. For example, computing device 1100 may not include a display device 1103, but may include display device interface circuitry (e.g., a connector and driver circuitry) to which display device 1103 may be coupled. In another set of examples, computing device 1100 may not include an audio output device 1104, other output device 1105, global positioning system (GPS) device 1109, audio input device 1110, or other input device 1111, but may include audio output device interface circuitry, other output device interface circuitry, GPS device interface circuitry, audio input device interface circuitry, audio input device interface circuitry, to which audio output device 1104, other output device 1105, GPS device 1109, audio input device 1110, or other input device 1111 may be coupled.

Computing device 1100 may include a processing device 1101 (e.g., one or more processing devices). As used herein, the term "processing device" or "processor" indicates a device that processes electronic data from registers and/or memory to transform that electronic data into other electronic data that may be stored in registers and/or memory. Processing device 1101 may include a memory 1121, a communication device 1122, a refrigeration device 1123, a battery/power regulation device 1124, logic 1125, interconnects 1126 (i.e., optionally including redistribution layers (RDL) or metal-insulator-metal (MIM) devices), a heat regulation device 1127, and a hardware security device 1128.

Processing device 1101 may include one or more digital signal processors (DSPs), application-specific ICs (AWBGs), central processing units (CPUs), graphics processing units (GPUs), cryptoprocessors (specialized processors that execute cryptographic algorithms within hardware), server processors, or any other suitable processing devices.

Computing device 1100 may include a memory 1102, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1102 includes memory that shares a die with processing device 1101. This memory may be used as cache memory and may include embedded dynamic random-access memory (eDRAM) or spin transfer torque magnetic random-access memory (STT-M RAM).

Computing device 1100 may include a heat regulation/refrigeration device 1106. Heat regulation/refrigeration device 1106 may maintain processing device 1101 (and/or other components of computing device 1100) at a predetermined low temperature during operation. This predetermined low temperature may be any temperature discussed herein.

In some embodiments, computing device 1100 may include a communication chip 1107 (e.g., one or more communication chips). For example, the communication chip 1107 may be configured for managing wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1107 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1107 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1107 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1107 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1107 may operate in accordance with other wireless protocols in other embodiments. Computing device 1100 may include an antenna 1113 to facilitate wireless communications and/or to receive other wireless communications (such as AM or FM radio transmissions).

In some embodiments, communication chip 1107 may manage wired communications, such as electrical, optical, or any other suitable communication protocols (e.g., the Ethernet). As noted above, communication chip 1107 may include multiple communication chips. For instance, a first communication chip 1107 may be dedicated to shorter-range wireless communications such as Wi-Fi or Bluetooth, and a second communication chip 1107 may be dedicated to longer-range wireless communications such as GPS, EDGE, GPRS, CDMA, WiMAX, LTE, EV-DO, or others. In some embodiments, a first communication chip 1107 may be dedicated to wireless communications, and a second communication chip 1107 may be dedicated to wired communications.

Computing device 1100 may include battery/power circuitry 1108. Battery/power circuitry 1108 may include one or more energy storage devices (e.g., batteries or supercapacitors) and/or circuitry for coupling components of computing device 1100 to an energy source separate from computing device 1100 (e.g., AC line power).

Computing device 1100 may include a display device 1103 (or corresponding interface circuitry, as discussed above). Display device 1103 may include any visual indicators, such as a heads-up display, a computer monitor, a projector, a touchscreen display, a liquid crystal display (LCD), a light-emitting diode display, or a flat panel display, for example.

Computing device 1100 may include an audio output device 1104 (or corresponding interface circuitry, as discussed above). Audio output device 1104 may include any device that generates an audible indicator, such as speakers, headsets, or earbuds, for example.

Computing device 1100 may include an audio input device 1110 (or corresponding interface circuitry, as discussed above). Audio input device 1110 may include any device that generates a signal representative of a sound, such as microphones, microphone arrays, or digital instruments (e.g., instruments having a muWBGal instrument digital interface (MIDI) output).

Computing device 1100 may include a GPS device 1109 (or corresponding interface circuitry, as discussed above). GPS device 1109 may be in communication with a satellite-based system and may receive a location of computing device 1100, as known in the art.

Computing device 1100 may include other output device 1105 (or corresponding interface circuitry, as discussed above). Examples of the other output device 1105 may include an audio codec, a video codec, a printer, a wired or wireless transmitter for providing information to other devices, or an additional storage device.

Computing device 1100 may include other input device 1111 (or corresponding interface circuitry, as discussed above). Examples of the other input device 1111 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1100 may include a security interface device 1112. Security interface device 1112 may include any device that provides security measures for computing device 1100 such as intrusion detection, biometric validation, security encode or decode, access list management, malware detection, or spyware detection.

Computing device 1100, or a subset of its components, may have any appropriate form factor, such as a hand-held or mobile computing device (e.g., a cell phone, a smart phone, a mobile internet device, a muWBG player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-11. The subject matter may be applied to other deposition applications, as well as any appropriate manufacturing application, as will be understood to those skilled in the art.

The following examples pertain to further embodiments, and specifics in the examples may be used anywhere in one or more embodiments.

Example 1 includes an IC device, comprising a plurality of layers of WBG-based circuitry, and a plurality of layers of Si-based circuitry monolithically bonded to the plurality of layers of WBG-based circuitry, with one or more electrical connections between respective WBG-based circuits in the plurality of layers of WBG-based circuitry and Si-based circuits in the plurality of layers of Si-based circuitry.

Example 2 includes the IC device of Example 1, wherein the plurality of layers of Si-based circuitry is hybrid bonded to the plurality of layers of WBG-based circuitry.

Example 3 includes the IC device of Example 1, wherein the plurality of layers of Si-based circuitry is layer transfer bonded to the plurality of layers of WBG-based circuitry.

Example 4 includes the IC device of any of Examples 1 to 3, further comprising a TWBGV through one or more layers of the plurality of layers of WBG-based circuitry to provide at least one of the one or more electrical connections between respective WBG-based circuits and Si-based circuits.

Example 5 includes the IC device of Example 4, further comprising dielectric material that surrounds the TWBGV, wherein the dielectric material has sufficient thickness to inhibit a breakdown of the dielectric material.

Example 6 includes the IC device of any of Examples 1 to 5, wherein the plurality of layers of WBG-based circuitry is bonded to a front-side of the plurality of layers of Si-based circuitry.

Example 7 includes the IC device of any of Examples 1 to 5, wherein the plurality of layers of WBG-based circuitry is bonded to a back-side of the plurality of layers of Si-based circuitry.

Example 8 includes the IC device of any of Examples 1 to 7, wherein the plurality of layers of WBG-based circuitry comprises a wafer-scale WBG-based IC and the plurality of layers of Si-based circuitry comprises a wafer-scale Si-based IC.

Example 9 includes a system, comprising a power supply, a wafer-scale WBG-based IC coupled to the power supply, and a wafer-scale Si-based IC monolithically bonded to the wafer-scale WBG-based IC, with one or more electrical connections between respective WBG-based circuits in the wafer-scale WBG-based IC and Si-based circuits in the wafer-scale Si-based IC.

Example 10 includes the system of Example 9 wherein a power device on the wafer-scale WBG-based IC is coupled to a logic device on the wafer-scale Si-based IC.

Example 11 includes the system of any of Examples 9 to 10, wherein the wafer-scale WBG-based IC is hybrid bonded to the wafer-scale Si-based IC.

Example 12 includes the system of Example 11, wherein a first side of the wafer-scale WBG-based IC is hybrid bonded to the wafer-scale Si-based IC and a second side of the wafer-scale WBG-based IC, opposite to the first side of wafer-scale WBG-based IC, has a non-flat surface.

Example 13 includes the system of any of Examples 9 to 10, wherein the wafer-scale WBG-based IC is layer transfer bonded to the wafer-scale Si-based IC.

Example 14 includes the system of any of Examples 9 to 13, further comprising a TWBGV through one or more layers of the wafer-scale WBG-based IC to provide at least one of the one or more electrical connections between respective WBG-based circuits and Si-based circuits.

Example 15 includes the system of Example 14, further comprising dielectric material that surrounds the TWBGV, wherein the dielectric material has sufficient thickness to inhibit a breakdown of the dielectric material.

Example 16 includes the system of any of Examples 9 to 15, wherein the wafer-scale WBG-based IC bonded to a front-side of the wafer-scale Si-based IC.

Example 17 includes the system of any of Examples 9 to 15, wherein the wafer-scale WBG-based IC is bonded to a back-side of the wafer-scale Si-based IC.

Example 18 includes the system of any of Examples 9 to 17, further comprising a cooling structure operable to remove heat from the wafer-scale WBG-based IC and the wafer-scale Si-based IC to achieve an operating temperature at or below −25° C.

Example 19 includes the system of Example 18, wherein the cooling structure further comprises a chiller mounted to the wafer-scale WBG-based IC and the wafer-scale Si-based IC, the chiller comprising one of a solid body comprising microchannels to convey a heat transfer fluid therein or a heat sink for immersion in a low-boiling point liquid.

Example 20 includes the system of Example 18, wherein the cooling structure is to convey liquid nitrogen to achieve an operating temperature at or below about −196° C.

Example 21 includes a method, comprising forming a plurality of layers of Si-based circuitry, forming a plurality of layers of WBG-based circuitry, monolithically bonding the plurality of layers of WBG-based circuitry to the plurality of layers of Si-based circuitry, and providing one or more electrical connections between respective WBG-based circuits in the plurality of layers of WBG-based circuitry and Si-based circuits in the plurality of layers of Si-based circuitry.

Example 22 includes the method of Example 21, further comprising hybrid bonding the plurality of layers of WBG-based circuitry to the plurality of layers of Si-based circuitry.

Example 23 includes the method of Example 22, further comprising flattening a first side of the plurality of layers of WBG-based circuitry prior to hybrid bonding the first side of the plurality of layers of WBG-based circuitry to the plurality of layers of Si-based circuitry, wherein a second side of the plurality of layers of WBG-based circuitry opposite to the first side has a non-flat surface after hybrid bonding.

Example 24 includes the method of Example 21, further comprising layer transfer bonding the plurality of layers of WBG-based circuitry to the plurality of layers of Si-based circuitry.

Example 25 includes the method of any of Examples 21 to 24, further comprising forming a TWBGV through one or more layers of the plurality of layers of WBG-based circuitry to provide at least one of the one or more electrical connections between respective WBG-based circuits and Si-based circuits.

Example 26 includes the method of Example 25, further comprising forming dielectric material that surrounds the TWBGV, wherein the dielectric material has sufficient thickness to inhibit a breakdown of the dielectric material.

Example 27 includes the method of any of Examples 21 to 26, further comprising bonding the plurality of layers of WBG-based circuitry to a front-side of the plurality of layers of Si-based circuitry.

Example 28 includes the method of any of Examples 21 to 26, further comprising bonding the plurality of layers of WBG-based circuitry to a back-side of the plurality of layers of Si-based circuitry.

Example 29 includes the method of any of Examples 21 to 28, wherein the plurality of layers of WBG-based circuitry comprises a wafer-scale WBG-based IC and the plurality of layers of Si-based circuitry comprises a wafer-scale Si-based IC.

Example 30 includes the method of any of Examples 21 to 29, further comprising providing a cooling structure operable to remove heat from the WBG-based circuitry and the Si-based circuitry to achieve an operating temperature at or below −25° C.

Example 31 includes an apparatus, comprising means for forming a plurality of layers of Si-based circuitry, means for forming a plurality of layers of WBG-based circuitry, means for monolithically bonding the plurality of layers of WBG-based circuitry to the plurality of layers of Si-based circuitry, and means for providing one or more electrical connections between respective WBG-based circuits in the plurality of layers of WBG-based circuitry and Si-based circuits in the plurality of layers of Si-based circuitry.

Example 32 includes the apparatus of Example 31, further comprising means for hybrid bonding the plurality of layers of WBG-based circuitry to the plurality of layers of Si-based circuitry.

Example 33 includes the apparatus of Example 32, further comprising means for flattening a first side of the plurality of layers of WBG-based circuitry prior to hybrid bonding the first side of the plurality of layers of WBG-based circuitry to the plurality of layers of Si-based circuitry, wherein a second side of the plurality of layers of WBG-based circuitry opposite to the first side has a non-flat surface after hybrid bonding.

Example 34 includes the apparatus of Example 31, further comprising means for layer transfer bonding the plurality of layers of WBG-based circuitry to the plurality of layers of Si-based circuitry.

Example 35 includes the apparatus of any of Examples 31 to 34, further comprising means for forming a TWBGV through one or more layers of the plurality of layers of WBG-based circuitry to provide at least one of the one or more electrical connections between respective WBG-based circuits and Si-based circuits.

Example 36 includes the apparatus of Example 35, further comprising means for forming dielectric material that surrounds the TWBGV, wherein the dielectric material has sufficient thickness to inhibit a breakdown of the dielectric material.

Example 37 includes the apparatus of any of Examples 31 to 36, further comprising means for bonding the plurality of layers of WBG-based circuitry to a front-side of the plurality of layers of Si-based circuitry.

Example 38 includes the apparatus of any of Examples 31 to 36, further comprising means for bonding the plurality of layers of WBG-based circuitry to a back-side of the plurality of layers of Si-based circuitry.

Example 39 includes the apparatus of any of Examples 31 to 38, wherein the plurality of layers of WBG-based circuitry comprises a wafer-scale WBG-based IC and the plurality of layers of Si-based circuitry comprises a wafer-scale Si-based IC.

Example 40 includes the apparatus of any of Examples 31 to 39, further comprising means for providing a cooling structure operable to remove heat from the WBG-based circuitry and the Si-based circuitry to achieve an operating temperature at or below −25° C.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. An integrated circuit (IC) device, comprising:
a plurality of layers of wide bandgap (WBG)-based circuitry;
a plurality of layers of silicon (Si)-based circuitry monolithically bonded to the plurality of layers of WBG-based circuitry, with one or more electrical connections between respective WBG-based circuits in the plurality of layers of WBG-based circuitry and Si-based circuits in the plurality of layers of Si-based circuitry; and
a through-WBG via (TWBGV) through one or more layers of the plurality of layers of WBG-based circuitry to provide at least one of the one or more electrical connections between respective WBG-based circuits and Si-based circuits.

2. The IC device of claim 1, wherein the plurality of layers of Si-based circuitry is hybrid bonded to the plurality of layers of WBG-based circuitry.

3. The IC device of claim 1, wherein the plurality of layers of Si-based circuitry is layer transfer bonded to the plurality of layers of WBG-based circuitry.

4. The IC device of claim 1, further comprising:
dielectric material that surrounds the TWBGV, wherein the dielectric material has sufficient thickness to inhibit a breakdown of the dielectric material.

5. The IC device of claim 1, wherein the plurality of layers of WBG-based circuitry is bonded to a back-side of the plurality of layers of Si-based circuitry.

6. The IC device of claim 1, wherein the plurality of layers of WBG-based circuitry comprises a wafer-scale WBG-based IC and the plurality of layers of Si-based circuitry comprises a wafer-scale Si-based IC.

7. A system, comprising:
a power supply;
a wafer-scale wide bandgap (WBG)-based integrated circuit (IC) coupled to the power supply;
a wafer-scale silicon (Si)-based (IC) monolithically bonded to the wafer-scale WBG-based IC, with one or more electrical connections between respective WBG-based circuits in the wafer-scale WBG-based IC and Si-based circuits in the wafer-scale Si-based IC; and
a cooling structure operable to remove heat from the wafer-scale WBG-based IC and the wafer-scale Si-based IC to achieve an operating temperature at or below −25° C.

8. The system of claim 7, wherein a power device on the wafer-scale WBG-based IC is coupled to a logic device on the wafer-scale Si-based IC.

9. The system of claim 7, wherein the wafer-scale WBG-based IC is hybrid bonded to the wafer-scale Si-based IC.

10. The system of claim 9, wherein a first side of the wafer-scale WBG-based IC is hybrid bonded to the wafer-scale Si-based IC and a second side of the wafer-scale WBG-based IC, opposite to the first side of the wafer-scale WBG-based IC, has a non-flat surface.

11. The system of claim 7, wherein the wafer-scale WBG-based IC is layer transfer bonded to the wafer-scale Si-based IC.

12. The system of claim 7, wherein the wafer-scale WBG-based IC is bonded to a back-side of the wafer-scale Si-based IC.

13. The system of claim 7, wherein the cooling structure further comprises a chiller mounted to the wafer-scale WBG-based IC and the wafer-scale Si-based IC, the chiller comprising one of a solid body comprising microchannels to convey a heat transfer fluid therein or a heat sink for immersion in a low-boiling point liquid.

14. The IC device of claim 1, further comprising:
a power supply and/or a cooling structure.

15. An integrated circuit (IC) device, comprising:
a plurality of layers of wide bandgap (WBG)-based circuitry; and
a plurality of layers of silicon (Si)-based circuitry monolithically bonded to the plurality of layers of WBG-based circuitry, with one or more electrical connections between respective WBG-based circuits in the plurality of layers of WBG-based circuitry and Si-based circuits in the plurality of layers of Si-based circuitry, wherein the plurality of layers of Si-based circuitry is layer transfer bonded to the plurality of layers of WBG-based circuitry or wherein the plurality of layers of WBG-based circuitry is bonded to a back-side of the plurality of layers of Si-based circuitry.

16. The IC device of claim 15, further comprising:
a through-WBG via (TWBGV) through one or more layers of the plurality of layers of WBG-based circuitry to provide at least one of the one or more electrical connections between respective WBG-based circuits and Si-based circuits; and
dielectric material that surrounds the TWBGV, wherein the dielectric material has sufficient thickness to inhibit a breakdown of the dielectric material.

17. The IC device of claim 15, wherein the plurality of layers of WBG-based circuitry comprises a wafer-scale WBG-based IC and the plurality of layers of Si-based circuitry comprises a wafer-scale Si-based IC.

18. The IC device of claim 1, further comprising:
a power supply and/or a cooling structure.

19. A system, comprising:

a power supply;

a wafer-scale wide bandgap (WBG)-based integrated circuit (IC) coupled to the power supply; and a wafer-scale silicon (Si)-based (IC) monolithically bonded to the wafer-scale WBG-based IC, with one or more electrical connections between respective WBG-based circuits in the wafer-scale WBG-based IC and Si-based circuits in the wafer-scale Si-based IC, wherein a first side of the wafer-scale WBG-based IC is hybrid bonded to the wafer-scale Si-based IC and a second side of the wafer-scale WBG-based IC, opposite to the first side of the wafer-scale WBG-based IC, has a non-flat surface, wherein the wafer-scale WBG-based IC is layer transfer bonded to the wafer-scale Si-based IC, or wherein the wafer-scale WBG-based IC is bonded to a back-side of the wafer-scale Si-based IC.

20. The system of claim 19, wherein a power device on the wafer-scale WBG-based IC is coupled to a logic device on the wafer-scale Si-based IC.

21. The system of claim 19, further comprising:

a cooling structure operable to remove heat from the wafer-scale WBG-based IC and the wafer-scale Si-based IC to achieve an operating temperature at or below −25° C.

22. The system of claim 21, wherein the cooling structure further comprises a chiller mounted to the wafer-scale WBG-based IC and the wafer-scale Si-based IC, the chiller comprising one of a solid body comprising microchannels to convey a heat transfer fluid therein or a heat sink for immersion in a low-boiling point liquid.

\* \* \* \* \*